United States Patent
Satoh et al.

(10) Patent No.: US 8,253,238 B2
(45) Date of Patent: Aug. 28, 2012

(54) RESIN-SEALED SEMICONDUCTOR DEVICE AND METHOD OF MANUFACTURING THE SAME

(75) Inventors: Masayuki Satoh, Chiba (JP); Koshi Maemura, Chiba (JP)

(73) Assignee: Seiko Instruments Inc., Chiba (JP)

( * ) Notice: Subject to any disclaimer, the term of this patent is extended or adjusted under 35 U.S.C. 154(b) by 191 days.

(21) Appl. No.: 12/882,896

(22) Filed: Sep. 15, 2010

(65) Prior Publication Data

US 2011/0068442 A1 Mar. 24, 2011

(30) Foreign Application Priority Data

Sep. 18, 2009 (JP) .................................. 2009-217642

(51) Int. Cl.
*H01L 23/48* (2006.01)
*H01L 21/00* (2006.01)

(52) U.S. Cl. .......................... 257/696; 257/676; 438/123

(58) Field of Classification Search .................. 257/696, 257/666, 676; 438/111, 123, 124
See application file for complete search history.

(56) References Cited

U.S. PATENT DOCUMENTS

| | | | | |
|---|---|---|---|---|
| 6,545,332 B2* | 4/2003 | Huang | ........................... | 257/433 |
| 7,535,085 B2* | 5/2009 | Jang | ............................... | 257/676 |
| 7,838,339 B2* | 11/2010 | Tsui et al. | ..................... | 438/123 |
| 7,847,392 B1* | 12/2010 | Choi et al. | ..................... | 257/696 |
| 7,968,998 B1* | 6/2011 | Choi | ............................. | 257/693 |
| 2004/0032016 A1* | 2/2004 | Anzai | ............................ | 257/685 |
| 2004/0145043 A1* | 7/2004 | Hayashi et al. | ............... | 257/696 |

FOREIGN PATENT DOCUMENTS

| | | |
|---|---|---|
| JP | 2005-050948 A | 2/2005 |
| JP | 2008-103550 A | 5/2008 |

* cited by examiner

*Primary Examiner* — Sheila V Clark
(74) *Attorney, Agent, or Firm* — Brinks Hofer Gilson & Lione

(57) ABSTRACT

In a resin-sealed semiconductor device, an inner lead including a bend portion formed by lifting has a protruding shape located on one side and an inclined vertical surface shape located on the other side (inside) in an external connection terminal direction. A cutaway portion is provided along the bend portion and an external connection terminal. A height of an upper surface portion of the inner lead is higher than a height of an upper surface of a semiconductor element. The inner lead is provided in a substantially central portion of a die pad so that the inclined vertical surface shape is parallel to a side of a die pad which includes a thin portion located in a side surface portion and an exposure portion located on a bottom surface.

17 Claims, 13 Drawing Sheets

RESIN-SEALED SEMICONDUCTOR DEVICE AND METHOD OF MANUFACTURING THE SAME

RELATED APPLICATIONS

This application claims priority under 35 U.S.C. §119 to Japanese Patent Application No. 2009-217642 filed on Sep. 18, 2009, the entire content of which is hereby incorporated by reference.

BACKGROUND OF THE INVENTION

1. Field of the Invention

The present invention relates to a resin-sealed semiconductor device and a method of manufacturing the resin-sealed semiconductor device, and more particularly, to a resin-sealed semiconductor device in which lifted inner leads are provided in a sealing resin member and external connection terminals are provided on a bottom surface of the sealing resin member, and a method of manufacturing the resin-sealed semiconductor device.

2. Description of the Related Art

In recent years, a semiconductor element having an improved function and a reduced size is required to be mounted on a resin-sealed semiconductor device which is reduced in thickness and size. In addition, it is required to increase a die pad occupying area ratio to improve mounting efficiency (chip area/package occupying area) in semiconductor device board mounting, to thereby obtain a high semiconductor element mounting ratio. Further, a resin-sealed semiconductor device which may satisfy the demand for high heat radiation is required. Accordingly, the resin-sealed semiconductor device needs to have a new structure.

FIGS. 14A, 14B, and 14C show a structure of a conventional resin-sealed semiconductor device as an example. The resin-sealed semiconductor device includes: a semiconductor element 1; a die pad 2 supporting the semiconductor element 1; a bonding material 3 for bonding the semiconductor element 1 to the die pad 2; a plurality of inner leads 5 electrically connected to the semiconductor element 1 through bonding wires 4; and a sealing member 6 for sealing the semiconductor element 1, the die pad 2, the bonding material 3, the bonding wires 4, and the inner leads 5 with a sealing resin (see, for example, Japanese Patent Application Laid-open No. 2005-050948).

A resin package size of the conventional example of the resin-sealed semiconductor device has a length of approximately 1.2 mm in the X-axis direction, a length of approximately 1.6 mm in the Y-axis direction, and a length of approximately 0.48 mm in the Z-axis direction.

Both sides of a tip end of each of the inner leads are expanded as illustrated in FIGS. 14A, 14B, and 14C so as to secure bonding areas and to give sufficient lead-pull strength as anchors in a bending strength test for board mounting.

When a wire loop is to be formed by conventional wire bonding, as in a case of a wire loop 4d illustrated in FIG. 15, a large spacing L12 is required for avoiding electrical contact between the wire loop 4d and an end portion of the semiconductor element 1, and hence a predetermined height and a predetermined space are necessary.

With respect to a conventional die pad occupying area, (die pad area)/(resin package area) is 37% since a resin package area is 1.9 mm$^2$ and a die pad area is 0.7 mm$^2$.

In a case where each of length and breadth of the resin package is set not more than 1 mm, the following conventional problem occurs. When the conventional inner leads 5 are provided with a length equal to a length to an end surface of the die pad located in the sealing member 6, the area in which the die pad is provided becomes smaller, and hence the mounting efficiency, which is one of the package functions and is expressed as (chip area/package occupying area), reduces.

In order to solve the problem from the past, a semiconductor device in which a contained semiconductor element is tilted relative to the semiconductor device is disclosed (see, for example, Japanese Patent Application Laid-open No. 2008-103550).

However, it has been found that the conventional semiconductor device has new problems in terms of reductions in size and thickness and an increase in heat radiation. Hereinafter, the problems are specifically described.

A first problem is that, when the conventional inner lead shapes and the heights and spaces which are required for the wire loops formed by wire bonding are taken into account, it is difficult to form the inner leads and the wire loops in a small-size resin package, for example, in a region of which longitudinal and lateral lengths each are equal to or smaller than 0.8 mm. To be specific, there may be the following three factors.

A first factor is that the conventional inner lead shapes are required to secure the bonding areas and the lead-pull strength for serving as the anchors, and hence the inner leads require spaces, making it difficult to reduce the size.

In order to secure the bonding areas and the lead-pull strength for serving as the anchors a minimum necessary length and width are to be provided to the inner leads. When unnecessarily achieve the reduction in size, the bonding areas cannot be sufficiently secured, and hence the bonding may be unstable and reduced in reliability. When the portions saving as the anchors are too small, the portions do not serve as the anchors, and hence the strengths become insufficient.

A second factor is that the conventional layout requires securing the height of each of the wire loops in the wire bonding and a necessary spacing between the semiconductor element and a second bond position, and hence it is difficult to reduce the size because of the necessary height and the necessary spacing.

As illustrated in FIG. 15, when wire bonding is performed by a "downhill bonding" method of performing wire bonding while a position of a second bond 4b on a lead terminal surface is significantly lower than a position of a first bond 4a on a bonding pad of the semiconductor element 1, it is necessary to increase a loop height of the bonding wire (wire loop) 4d in order to prevent an easy electrical contact with the upper end portion of the semiconductor element 1 caused by an insufficient height of the wire loop. Accordingly, there is a disadvantage that it is necessary to thicken a resin thickness of the upper surface of the bonding pad of the semiconductor element 1. In addition, there is a disadvantage that, when a position shift amount of the semiconductor element 1 in a case of die bonding, a capillary diameter in a case of the second bond 4b, and a spacing for avoiding the electrical contact with the upper end portion of the semiconductor element 1 are taken into account, for example, the spacing L12 between the semiconductor device 1 and the second bond 4b increases.

A third factor is as follows. Since spacing between a bottom end portion of the die pad and an end portion of the external connection terminal becomes smaller with a reduction in size, in order to avoid a short circuit between board mounting wiring patterns during board mounting, it is necessary to secure a predetermined spacing between the bottom end portion of the die pad and the end portion of the external connection terminal. However, the securing of the predetermined spacing greatly hinders the reduction in size.

In an example of a quad flat no-lead (QFN) package, a lead spacing cannot be reduced because of constraint on etching due to corrosion removal and isotropy, and hence the spacing between the bottom end portion of the die pad and the end portion of the external connection terminal takes a large value. In an example of a package produced by electroforming, a large protrusion cannot be provided because of constraint on plating. When a small lead is formed, sufficient strength cannot be obtained to prevent separation from the sealing resin. This hinders the formation of the small lead. These examples of the QFN package and the package produced by electroforming show that such constraint causes an increase in size of the resin package and hinders the reduction in size.

A second problem is that it is more difficult to reduce the space necessary to provide the inner leads and the wire loops and to increase mounting efficiency (chip area/package occupying area) in mounting on the semiconductor device board of which a die pad occupying area ratio is not less than 30%.

When respective necessary functions are provided on the same area as in a conventional case without the reduction in size of the inner leads and the size of the resin package is reduced, the mounting area of the die pad reduces. Expansion of the mounting surface of the die pad for necessary length and width directly increases the package occupying area, degrading the mounting efficiency (chip area/package occupying area) in mounting on the semiconductor device board.

A third problem is that it is necessary to increase heat radiation efficiency of the semiconductor element of which a function is improved and a size is reduced.

Though in a conventional semiconductor device, generated heat from a semiconductor element transfers to a mounting pattern of a mounting board only through the external connection terminal in a case of a lifted die pad, a heat transfer distance between the semiconductor element and the mounting pattern of the mounting board also serving as a heat radiation portion for radiating heat to an outside of a sealing resin is long, and it is difficult to secure a contact area between the external connection terminal and the mounting pattern, with a result that generated heat from the semiconductor element cannot be efficiently radiated. Thus, generated heat from the semiconductor element is not sufficiently radiated, and hence there is a problem that the semiconductor element breaks because of thermal runaway, to thereby significantly reduce reliability. Even a semiconductor device of which a die pad is exposed from the bottom surface has the same problem in a case where the die pad is made of a low-heat conductivity material.

SUMMARY OF THE INVENTION

The present invention has been made in view of the problems described above. An object of the present invention is to provide a resin-sealed semiconductor device which is reduced in size and thickness, has high mounting efficiency (chip area/package occupying area), and is suitable for high heat radiation. Another object of the present invention is to provide a manufacturing method capable of realizing low-cost production while reliability is maintained.

The problems described above may be solved by the following measures in order to achieve the objects.

1. A resin-sealed semiconductor device according to the present invention includes: a semiconductor element; a die pad supporting the semiconductor element; a bonding material for bonding the semiconductor element to the die pad; bonding wires; a plurality of signal leads electrically connected to the semiconductor element through the bonding wires; and a sealing member for sealing the semiconductor element, the bonding material, the bonding wires, and a part of the plurality of signal leads with a sealing resin, in which: a central portion of each of the plurality of signal leads is lifted from a peripheral portion thereof; the die pad includes an exposure portion which is at least a part of a bottom surface of the die pad and exposed on a bottom surface of the sealing member; each of the plurality of signal leads includes an exposure portion which corresponds to an end portion of corresponding one of the plurality of signal leads and is partially exposed as an external connection terminal on the bottom surface of the sealing member; the die pad further includes a thin portion provided substantially parallel to a mounting surface of the die pad in a side surface portion of the die pad; each of the plurality of signal leads further includes an lifted inner lead which corresponds to the other end portion of corresponding one of the plurality of signal leads; and the lifted inner lead includes: a bend portion for aligning an upper surface of the die pad and a rear surface of the lifted inner lead to substantially the same height; a protruding shape portion provided on one side in a signal lead width direction; and an inclined vertical surface provided on the other side as the inside in the signal lead width direction.

According to the structure, the reduction in size of the inner lead may be achieved using the bend portion, the protruding shape portion, and the inclined vertical surface shape.

Since the lifted inner lead located in the end portion of the signal lead includes the protruding shape portion provided on one side in the signal lead width direction and the inclined vertical surface provided on the other side as the inside in the signal lead width direction, the protruding shape portion provided on the one side serves to secure a bonding area and as an anchor and the inclined vertical surface provided on the other side serves to minimize spacing between the inner lead and the die pad, permitting realization of an inner lead having a minimum shape and a very small size. The protruding shape portion provided on one side may serve to secure share strength necessary for an external connection terminal pull strength test of a mounting bending strength test. The inclined vertical surface provided on the other side may serve to increase the degree of freedom of a layout of the inner lead in the sealing member.

The lifted inner lead corresponding to the end portion of the signal lead includes the bend portion for aligning the upper surface of the die pad and the rear surface of the inner lead to substantially the same height, and hence a rear surface side region of the inner lead in the sealing resin is filled with a sealing resin material. Thus the external connection terminal is not separated from the sealing resin, even when the bottom surface of the external connection terminal is exposed from the bottom surface of the sealing resin. This is suitable to form a shape for size reduction. The bend portion is provided to separate the rear surface portion of the inner lead from the bottom surface portion of the external connection terminal, and hence the spacing from the die pad may be obtained. Thus, a distance for avoiding a short circuit between mounting wiring patterns connected to the external connection terminal may be secured to minimize the spacing between the inner lead and the die pad.

A protruding length of the thin portion provided in substantially parallel to the side surface of the die pad is desirably equal to a distance between the bottom surface of the main body of the die pad and the bottom surface of the thin portion or in a range of up to two times the distance. In this case, the die pad may be reliably prevented from being separated from the sealing resin. In addition, the mounting surface of the die pad expands, and hence pads for connecting the bonding wires to bonding portions located in peripheral regions of the mounting surface may be reliably provided. When the protruding length of the thin portion is lengthened, the spacing between an end portion of the bottom surface of the die pad and a protruding end part of the thin portion may be secured. Accordingly, the spacing between the end portion of the bottom surface of the die pad and an end portion of the external connection terminal may be lengthened, and hence the distance for avoiding the short circuit between the mounting wiring patterns connected to the external connection terminal may be secured to minimize the spacing between the inner lead and the die pad.

The die pad includes an exposure portion which is at least a part of the bottom surface of the die pad and exposed on a bottom surface of the sealing member. The exposure portion of the die pad and an exposure portion of the external connection terminal are provided on substantially the same plane. Accordingly, when a bottom surface side of the sealing resin is to be mounted on a mounting board, the die pad is in direct contact with a surface of the mounting board, and hence heat generated from the semiconductor element is directly transferred from the die pad to the mounting board. As a result, a heat transfer distance between the semiconductor element and the mounting board is shortened.

2. Further, in the structure of the present invention, it is preferred that the protruding shape portion of the lifted inner lead which is located on the one side be provided in a direction toward an outside of the sealing member, and that the inclined vertical surface of the lifted inner lead which is located on the other side be provided in a direction toward an inside of the sealing member.

In the case of such a structure, since the protruding shape portion of the lifted inner lead which is located on the one side is provided in a direction toward an outside of the sealing member, and the inclined vertical surface of the lifted inner lead which is located on the other side is provided in a direction toward an inside of the sealing member, the protruding shape portion located on the one side serves to secure the bonding area and as an anchor satisfying a lead pull strength in a mounting bending strength test. In addition, since the inclined vertical surface located on the other side serves to reduce the distance from the die pad to a minimum value, a small-size inner lead for efficiently designing a layout in the sealing member may be realized.

3. Further, in the structure of the present invention, the bend portions includes a vertical shape portion relative to a bottom surface of the external connection terminal, which is formed between an upper surface portion of the lifted inner lead and an upper surface portion of the external connection terminal and between a rear surface portion of the lifted inner lead and a bottom surface portion of the external connection terminal. The vertical shape portion has an angle in a range of 80° to 90° relative to the external connection terminal.

In the case of such a structure, the vertical shape portion is formed immediately under a flat connection portion of the signal lead, and hence wire bonding connection in a region immediately above the vertical shape portion may be performed. In addition, a special receiving portion from below is unnecessary and the space is small. Thus, a wire bonding load and an ultrasonic vibration are effectively transferred in a case of the connection, and hence excellent wire bonding is obtained and reliability is improved.

4. Further, in the structure of the present invention, it is preferred that the vertical shape portion of the bend portion include a surface parallel to a side of the sealing member, and that the inclined vertical surface provided on the inside in the signal lead width direction be opposed in parallel to a side of the die pad.

In the case of such a structure, the surface of the vertical shape portion of the bend portion is made parallel to the side of the sealing member, and hence the bend portion is stably and easily formed. A mounting wiring pattern connected to a lower (rear) surface portion of the external connection terminal is parallel to the external connection terminal, and hence mounting efficiency in mounting on the board is improved. The inclined vertical surface provided on the inside in the signal lead width direction is opposed in parallel to the side of the die pad, and hence there is an effect of minimizing the distance between the inner lead and the die pad.

5. Further, in the structure of the present invention, it is preferred that the lifted inner lead further include a cutaway portion provided along the bend portion and the external connection terminal on a side of the inclined vertical surface located on the inside in the signal lead width direction.

In the case of such a structure, the cutaway portion is provided along the bend portion and the external connection terminal, and hence the spacing from the exposure portion of the die pad may be lengthened by increasing a size of the cutaway portion and the short circuit between the board mounting wiring patterns may be avoided. A contact area on the mounting board may be increased without narrowing a width of the external connection terminal, and hence a mounting strength in a case where soldering is performed on the mounting board may be increased.

6. Further, in the structure of the present invention, it is preferred that a height of the upper surface portion of the lifted inner lead be higher than an upper surface height of the semiconductor element provided on the die pad.

In the case of such a structure, when "uphill bonding" is performed in which a position of a second bond is higher than a position of a first bond, a loop height is minimized and a height difference between the upper surface of the semiconductor element and the upper surface portion of the inner lead is easily maintained, and hence the risk of electrical short circuit therebetween may be reduced. Further, since the height difference between the upper surface of the semiconductor element and the upper surface portion of the inner lead is easily maintained, and the inner lead can be brought close to a bonding pad of the semiconductor element, a loop length and loop height of the bonding wire can be necessarily reduced, and hence a device size and a device outline height can be reduced. In addition, the bend portion is provided, and hence the upper surface of the semiconductor element mounted on the die pad and the upper surface of the inner lead relative to the bottom surface of the sealing resin are close to each other. Thus, a distance between the bonding pad provided on the upper surface of the semiconductor element and the inner lead is short. As a result, a length of the bonding wire for connecting the bonding pad and the inner lead may be shortened.

7. and 8. Further, in the structure of the present invention, it is preferred that a flat upper surface portion length of the lifted inner lead be longer than a flat rear surface portion length of the lifted inner lead, and that a flat rear surface portion length of the external connection terminal be longer than a flat upper surface portion length of the external connection terminal.

In the case of such a structure, the flat upper surface portion length of the inner lead which serves as a wire bonding connection region, the flat length for forming the sealing member in the upper surface portion of the external connection terminal, and the flat length of the rear surface portion of the external connection terminal are maintained at necessary lengths. The inner lead per se may be reduced in size by an increased amount of the flat length of the upper surface portion of the inner leads provided on both sides of the die pad and an increased amount of the flat length of the rear surface portion of the external connection terminal. Accordingly, an inner lead having an even smaller size may be realized.

9. Further, in the structure of the present invention, it is preferred that the die pad and each of the plurality of signal leads be 50 µm to 80 µm in thickness.

In the case of such a structure, a very small-size inner lead which includes the protruding shape portion located on the one side, the inclined vertical surface located on the other side as the inside in the external connection terminal direction, and the vertical bend portion may be obtained.

10. Further, in the structure of the present invention, it is preferred that a distance between a tip end portion side of the thin portion of the die pad and the inclined vertical surface of the lifted inner lead be smaller than a thickness of the die pad. In this case, it is preferred that the distance between the side of the die pad and the inclined vertical surface be 30 µm to 80 µm.

In the case of such a structure, since the inner lead may be brought close to a side of a tip end portion of the thin portion of the die pad, and the loop length and loop height of the bonding wire may be necessarily reduced, permitting reduction in the device size and the device outline height.

11. Further, in the structure of the present invention, it is preferred that the die pad include at least one pair of hanger pin shape portions which are formed from vertex portions of sides of the die pad and extend to sides of the sealing member at the same thickness as the die pad.

In the case of such a structure, since the thin portion of the die pad is formed by rolling, and the thin portion may be easily and reliably provided without bending the die pad, permitting reliable assignment of the expanse and flatness of the mounting surface.

12. Further, in the structure of the present invention, it is preferred that the lifted inner lead be provided in a substantially central portion of each side of the die pad at the distance of Item 10 described above.

In the case of such a structure, the surface of the vertical shape portion of the bend portion is parallel to the side of the sealing member, and the inclined vertical surface of the lifted inner lead which is provided on the inside in the signal lead width direction is opposed in parallel to the side of the die pad. Accordingly, four corner spaces of the sealing member are provided in respective sides of the die pad, and hence the inner lead is provided in the sealing member with high efficiency, to thereby reduce the size of the sealing member.

A wire loop may be formed into a suitable shape between the semiconductor element and the inner lead at a minimum length. The use of the sealing resin material in the four corner spaces of the sealing member is maximized to fill the rear surface side region of the inner lead with the sealing resin material, and hence a holding force for the inner lead becomes larger.

13. Further, in the structure of the present invention, it is preferred that the lifted inner leads be provided to sandwich at least one pair of hanger pin shape portions provided in vertex portions of sides of the die pad.

In the case of such a structure, the lifted inner leads are provided to sandwich at least one pair of hanger pin shape portions provided in vertex portions of the respective sides of the die pad. Accordingly, regions under the bottom surface of the thin portion of the die pad and the rear surface of the inner lead are efficiently filled with the sealing resin material.

14. Further, in the structure of the present invention, it is preferred that the thin portion provided substantially parallel to the mounting surface of the die pad in the side surface portion of the die pad include a pair of thin portions each of which is linked to two sides of the side surface portion of the die pad.

In the case of such a structure, the thin portion provided substantially parallel to the mounting surface of the die pad in the side surface portion of the die pad includes a pair of thin portions each of which is linked to two sides of the side surface portion of the die pad. The thin portion of the die pad is formed by rolling so that parallel sides are paired and have the same length, and hence the thin portion may be easily and reliably formed without bending the die pad. Thus, the expansion and flatness of the mounting surface may be reliably obtained. A sealing resin material filling the region on the bottom surface of the thin portion is further expanded.

A thickness of the thin portion is desirably in a range of approximately 20% to approximately 90% of a thickness of the main body of the die pad. Accordingly, a height difference between the bottom surface of the main body of the die pad and the bottom surface of the thin portion is in a range of approximately 10% to approximately 80% of the thickness of the main body of the die pad.

Since the bottom surface side region of the thin portion of the die pad in the sealing resin is filled with the sealing resin material, the die pad and the external connection terminal are not easily separated even when the bottom surface of the die pad and the bottom surface of the external connection terminal are exposed. It is preferred that the protruding length of the thin portion be equal to the distance between the bottom surface of the die pad and the bottom surface of the thin portion or in a range of up to two times the distance.

15. Further, in the structure of the present invention, it is preferred that the resin-sealed semiconductor device be 0.5 mm to 1.0 mm in side length.

In the case of such a structure, a resin-sealed semiconductor device having a very small size may be provided in which a ratio of a die pad area to a resin package size is most efficiently set in the range described above, to thereby contribute to the improvement of the mounting efficiency of the semiconductor element in mounting on the semiconductor device board. In a case of 1.0 mm or more, the die pad area ratio in the conventional example (Japanese Patent No. 4050199) is excellent. However, in a case of 0.5 mm or less, the die pad area ratio is reduced, and hence a mountable size of the semiconductor element is too small to be practical.

16. Further, a method of manufacturing a resin-sealed semiconductor device according to the present invention includes: preparing a lead frame, including forming the die pad and a plurality of signal leads and forming a protruding shape portion and an inclined vertical surface in each of the inner leads, forming a bend portion between each of the inner leads and the external connection terminal, and forming the thin portion in a side surface portion of the die pad; mounting a semiconductor element on the lead frame; electrically connecting the semiconductor element to the inner leads through bonding wires; sealing the semiconductor element, the die pad, the bonding material, the bonding wires, and the plurality of signal leads with a sealing resin; and separating the resin-sealed semiconductor device from a main body of lead frame.

In the case of such a structure, since an inner lead having a minimum shape and a very small size is used to obtain a high semiconductor element mounting ratio and shorten the heat transfer distance between the semiconductor element and the mounting board, a break of the semiconductor element due to thermal runaway and reduction in reliability may be avoided, and hence a sealed type semiconductor device which has high mounting efficiency in mounting on the semiconductor device board and is very thin and small in size may be manufactured at low cost.

According to the present invention as described above, the following various effects may be realized.

The use of the spaces and the surfaces in the sealing member of the resin-sealed semiconductor device is maximized, and hence the resin-sealed semiconductor device may be reduced in size, thinned, and provided with high heat radiation.

Firstly, a resin-sealed semiconductor device having a very small size may be provided in which (1) an inner lead having a minimum space and a maximum function is reduced in size, (2) a height and space of a wire loop formed by wire bonding are suppressed from increasing, and (3) a short circuit between board mounting wiring patterns is avoided to minimize a spacing between the inner lead and the die pad. The three points are described in detail below.

(1) When the inner lead having the minimum space and the maximum function is to be reduced in size, the inner lead serves to secure a bonding area and as an anchor, to thereby minimize the spacing from the die pad. Accordingly, the reduction in size may be achieved. A signal lead having a thickness in a range of 50 µm to 80 µm is used. The vertical shape portion is formed between the rear surface portion of the inner lead and the lower surface portion of the external connection terminal. The flat upper surface portion length of the inner lead is set to a value larger than the flat rear surface portion length thereof. The flat rear surface portion length of the external connection terminal is set to a value larger than the flat upper surface portion length thereof. The protruding shape portion is provided on the one side in the signal lead width direction and the inclined vertical surface is provided on the other side as the inside in the signal lead width direction. In such a case, the protruding shape portion provided on the one side serves to secure the bonding area and as the anchor, to thereby save the space for the inner lead to reduce the size thereof.

(2) When the height and space of the wire loop formed by wire bonding is to be suppressed from increasing, the bend portion is provided to align the upper surface of the die pad and the rear surface of the inner lead to substantially the same height. Accordingly, the upper surface of the semiconductor element mounted on the die pad is close to the upper surface of the inner lead, and hence a distance between the bonding pad provided on the upper surface of the semiconductor element and the inner lead is short. As a result, a length of a wire for connecting the bonding pad to the inner lead may be shortened. A height difference between the upper surface of the semiconductor element and the upper surface of the inner lead is reduced, and hence the loop length and loop height of the bonding wire may be reduced. Thus, a resin-sealed semiconductor device which is very thin and small in size may be provided.

(3) When the short circuit between the board mounting wiring patterns is to be avoided, the spacing between the end portion of the bottom surface of the die pad and the end portion of the external connection terminal, which is a distance between the board mounting wiring patterns, is secured. Accordingly, the short circuit between the board mounting wiring patterns connected to the external connection terminal may be avoided.

The bonding portion is provided in the inner lead, and hence the rear surface side region of the inner lead is filled with the sealing resin material. Accordingly, even when the external connection terminal is exposed on the bottom surface of the sealing resin, the external connection terminal is not separated from the sealing resin. Even when the inner lead is brought close to the die pad, the spacing between the end portion of the bottom surface of the die pad and the end portion of the external connection terminal may be secured. When the protruding length of the thin portion is made equal to the distance between the bottom surface of the main body of the die pad and the bottom surface of the thin portion or in a range of up to two times the distance, the die pad may be reliably prevented from being separated from the sealing resin. In addition, the mounting surface of the die pad expands. Further, when the cutaway portion is provided along the bend portion and the external connection terminal, a predetermined spacing may be set based on the size of the cutaway portion while the width of the external connection terminal is widened. This is suitable to form a size reduction shape capable of securing the distance between the board mounting wiring patterns.

Secondly, a small-size resin-sealed semiconductor device may be provided in which (1) a die pad structure includes a pair of hanger pin shape portions and a pair of thin portions each of which is linked to two sides, (2) the inner leads are provided at substantially the centers of the sides of the die pad to sandwich the pair of hanger pin shape portions, and (3) the die pad is provided so that the protruding length of the thin portion is two times to obtain high mounting efficiency (chip area/package occupying area). The three points are described in detail below.

(1) When the die pad structure includes the pair of hanger pin shape portions and the pair of thin portions each of which is linked to the two sides, a die pad may be provided in which functions including flatness of the mounting surface, efficient filling of the sealing resin material, avoidance of separation from the sealing resin, avoidance of the short circuit between the mounting wiring patterns, and direct heat transfer to the mounting board are satisfied to obtain a maximum mounting surface.

(2) When the inner leads are provided at substantially the centers of the sides of the die pad to sandwich the pair of hanger pin shape portions, the use of the sealing resin material in the four corner spaces of the sealing member is maximized to increase the holding force for the inner lead sealed with the sealing resin material. In addition, (3) while the protruding length of the thin portion is two times, the distance to the die pad may be reduced to a minimum value, and hence the mounting area of the die pad may be maximized.

Thirdly, a resin-sealed semiconductor device may be provided in which the problem of the heat radiation from the semiconductor element is solved and reliability is high. That is, in a case of mounting on the mounting board, when a heat transfer distance of heat directly transferred from the exposure portion of the die pad to the board surface is shortened, and a lead frame having excellent heat conductivity and a die pad having a large area for mounting the semiconductor element are used, a break of the semiconductor element due to thermal runaway and reduction in reliability may be avoided.

BRIEF DESCRIPTION OF THE DRAWINGS

In the accompanying drawings:

FIGS. 1A and 1B illustrate an example of a resin-sealed semiconductor device according to an embodiment of the prevent invention, in which FIG. 1A is a perspective view seeing through a sealing member for illustrating a schematic structure of the resin-sealed semiconductor device and FIG. 1B is a side view of the resin-sealed semiconductor device;

FIGS. 5A, 5B, and 5C illustrate examples of a wire loop according to the embodiment of the present invention, in which FIG. 5A is a side view, FIG. 5B is a perspective view, and FIG. 5C is a side view illustrating a case where a semiconductor element has a different thickness;

FIGS. 10A, 10B, 10C, and 10D illustrate an example of a method of manufacturing the resin-sealed semiconductor device according to the embodiment of the prevent invention, which are mold cross sectional views illustrating steps of forming the inner leads and the die pad in a shape in a process of preparing the lead frame, in which FIG. 10A is a configuration view illustrating an upper bend formation mold, a lower bend formation mold, and the lead frame, FIG. 10B illustrates a press state in which bend portions are formed by the upper bend formation mold and the lower bend formation mold, FIG. 10C illustrates a press state in which vertical shape portions are formed by an upper bend formation mold and a lower bend formation mold which are used to form the vertical shape portions, and FIG. 10D illustrates a press state in which thin portions of the die pad are formed by an upper thin portion formation mold and a lower thin portion formation mold which are used to form the thin portions;

FIGS. 11A and 11B are die pad size comparison plan views for illustrating an example of formation of the thin portions of the die pad according to the embodiment of the present invention, in which FIG. 11A is a plan view before the formation of the thin portions of the die pad and FIG. 11B is a plan view after the formation of the thin portions thereof;

FIGS. 12A and 12B are perspective views illustrating an example of the wire loop according to the embodiment of the present invention in comparison to a conventional wire loop, in which FIG. 12A is a side view illustrating the example of the wire loop according to the embodiment and FIG. 12B is a side view illustrating the conventional wire loop;

DETAILED DESCRIPTION OF THE PREFERRED EMBODIMENT

Hereinafter, a resin-sealed semiconductor device according to an embodiment of the present invention is described with reference to the attached drawings.

Figure 1A:
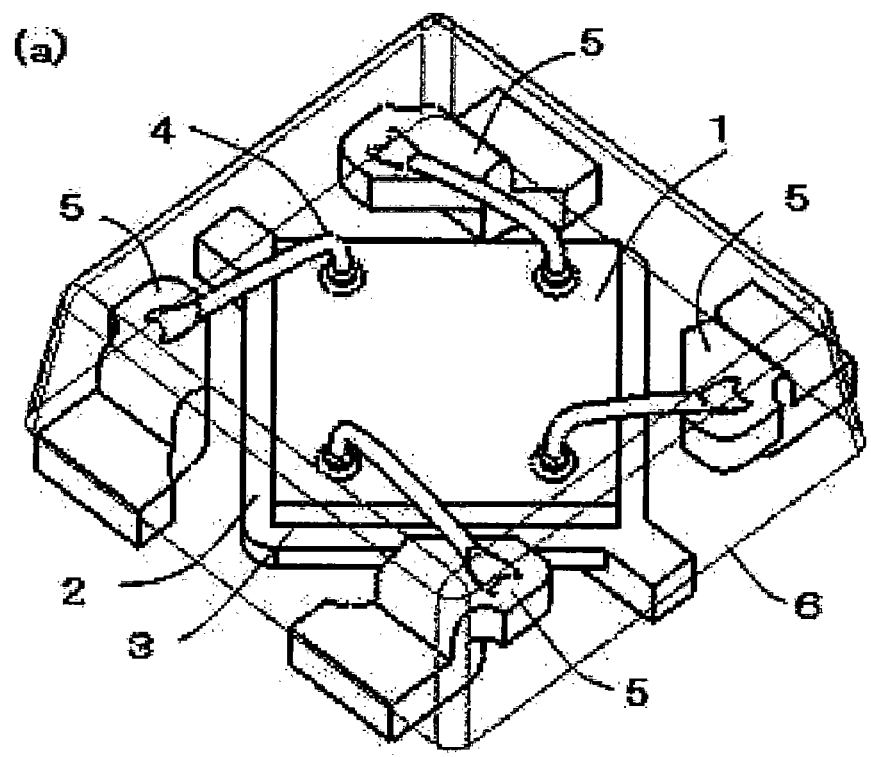
Figure 1B:
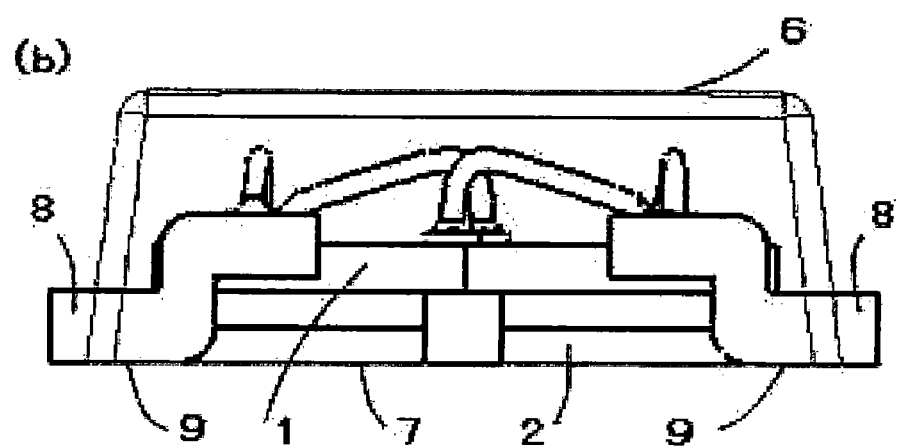

FIGS. 1A and 1B illustrate an example of the resin-sealed semiconductor device according to the embodiment of the prevent invention. FIG. 1A is a perspective view seeing through a sealing member for illustrating a schematic structure of the resin-sealed semiconductor device, and FIG. 1B is a side view of the resin-sealed semiconductor device.

As illustrated in FIG. 1A, the resin-sealed semiconductor device according to the embodiment of the prevent invention includes a semiconductor element 1, a die pad 2 supporting the semiconductor element 1, a bonding material 3 disposed on a mounting surface of the die pad 2 to bond the semiconductor element 1 to the die pad 2, a plurality of signal leads 5 electrically connected to the semiconductor element 1 through bonding wires 4, and a sealing member 6 for sealing the semiconductor element 1, the die pad 2, the bonding material 3, the bonding wires 4, and a portion of each of the signal leads 5 with a sealing resin. A central portion of each of the signal leads 5 serves as an inner lead 5 and is lifted from a peripheral portion thereof. Circumferential sides of the die pad 2 are not parallel but oblique to circumferential sides of the resin-sealed semiconductor device. The inner leads 5 are arranged in corner portions of the resin-sealed semiconductor device, which are regions where the die pad is not located in the resin-sealed semiconductor device. The die pad 2 includes a die pad exposure portion 7 in which at least a portion of a bottom surface of the die pad 2 is exposed at a bottom surface of the sealing member 6.

As illustrated in FIG. 1B, end portions of the signal leads 5 include external connection terminal exposure portions 9 serving as external connection terminals 8. Surfaces of the external connection terminal exposure portions 9 are partially exposed at the bottom surface of the sealing member 6. When a bottom surface side of the sealing resin is to be mounted on a mounting board, the die pad exposure portion 7 on the bottom surface of the die pad 2 is brought into direct contact with a surface of the mounting board, and hence heat generated from the semiconductor element 1 is directly transferred from the die pad exposure portion 7 on the bottom surface of the die pad 2 to the mounting board. As a result, a heat transfer distance between the semiconductor element 1 and the mounting board is shortened. Here, heat is also directly transferred from the external connection terminal exposure portions 9 of the external connection terminals 8 to the mounting board. However, a transfer ratio of heat from the die pad exposure portion 7 close to the semiconductor element 1 is significantly large, and hence heat radiation efficiency is improved.

Next, the inner leads 5 according to the embodiment of the present invention are described with reference to the attached drawings.

Figure 2A:
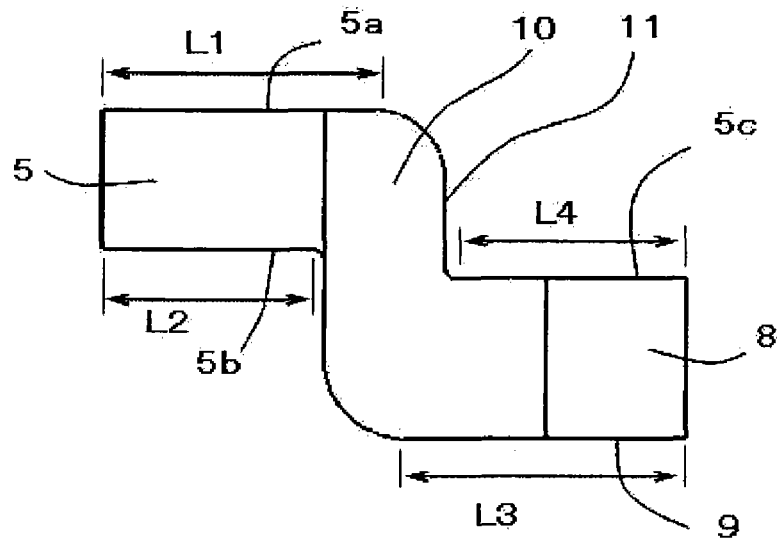
FIGS. 2A, 2B, and 2C each are a side view, a plan view, and a perspective view, respectively, for illustrating an example of an inner lead according to an embodiment of the present invention.
Figure 2B:
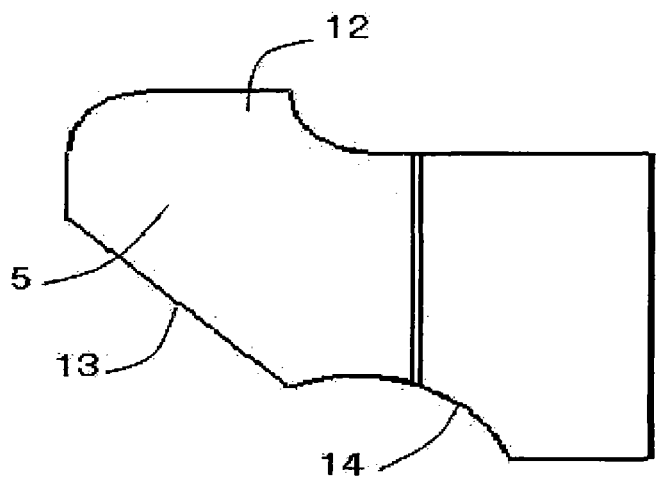
Figure 2C:
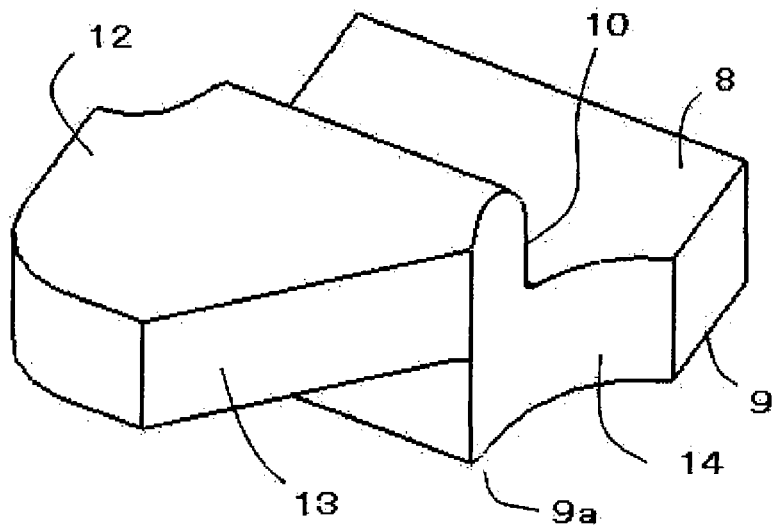

FIGS. 2A, 2B, and 2C each are a side view, a plan view, and a perspective view, respectively, illustrating an example of the inner lead 5 according to the embodiment of the present invention.

As illustrated in FIG. 2A, the inner lead 5 corresponds to the end portion of each of the signal leads which is lifted. The inner lead 5 includes a bend portion 10, which makes an inner lead rear surface portion 5b corresponding to a rear surface of the inner lead 5 substantially equal in height to an upper surface of the die pad 2, and hence a rear surface side region of the inner lead 5 in the sealing resin is filled with a sealing resin material. Accordingly, even when the external connection terminal exposure portion 9 corresponding to the bottom surface of the external connection terminal 8 is exposed at the bottom surface of the sealing resin, the external connection terminal 8 is resistant to separation from the sealing resin.

The inner lead rear surface portion 5b and the external connection terminal exposure portion 9 which is the bottom surface of the external connection terminal 8 are separated from each other by the size of the bend portion 10, and hence the external connection terminal exposure portion 9 may be separated from the die pad exposure portion 7 which is the bottom surface portion of the die pad 2 by the size of the bend portion 10 and the inner lead rear surface portion 5b, as a board mounting spacing. Accordingly, the distance for avoiding a short circuit may be secured between mounting wiring patterns connected to the external connection terminal 8, to thereby minimize an amount of spacing between a tip end of the inner lead 5 and a tip end of the mounting surface of the die pad 2, and hence the shape for size reduction is suitably formed. An inner lead upper surface portion 5a which is the upper surface of the lifted inner lead 5 is close to the upper surface of the semiconductor element 1 mounted on the die pad 2 because of the bend portion 10, and hence a distance between the bonding pad provided on the upper surface of the semiconductor element 1 and the inner lead 5 is reduced. As a result, a length of the bonding wire 4 for connecting the bonding pad and the inner lead 5 may be shortened by the bend portion 10.

As illustrated in FIG. 2A, a vertical shape portion 11 is formed relative to the external connection terminal exposure portion 9, in the bend portion 10 between the lifted inner lead upper surface portion 5a and the upper surface portion of the external connection terminal 8 and between the lifted inner lead rear surface portion 5b and the external connection terminal exposure portion 9. The vertical shape portion 11 has an angle in a range of 80° to 90° relative to the external connection terminal exposure portion 9.

The vertical shape portion 11 is formed immediately below the inner lead upper surface portion 5a serving as a flat wire bonding connection portion of the inner lead 5, and hence wire bonding connection may be performed in a region immediately close to a top of the vertical shape portion 11. Accordingly, the inner lead 5 which does not require a specific receiving portion from below and has a small space may be formed. A wire bonding load and an ultrasonic vibration are effectively transferred through the vertical shape portion 11 located immediately below the inner lead upper surface portion 5a, and hence the inner lead 5 having excellent wire bonding, high reliability, and a small size may be obtained.

As illustrated in FIG. 2A, a length L1 of the flat inner lead upper surface portion 5a of the lifted inner lead 5 is set to a value larger than that of a length L2 of the flat inner lead rear surface portion 5b of the lifted inner lead 5, leading to an increase in area of the flat upper surface portion of the lifted inner lead 5.

A length L3 of the flat external connection terminal exposure portion 9 of the external connection terminal 8 is set to a value larger than that of a length L4 of a flat external connection terminal upper surface portion 5c of the external connection terminal 8, leading to an increase in area of the flat rear surface portion of the external connection terminal 8.

While maintaining a necessary area of the flat portion of the inner lead 5 which serves as a wire bonding connection region and a necessary area of the flat rear surface portion of the external connection terminal 8, the inner lead 5 itself may be reduced in sized by the increase in the length L1 of the flat inner lead upper surface portion 5a of each of the inner leads 5 provided on both sides of the die pad 2 and by the increase in the length L3 of the flat external connection terminal exposure portion 9 of the external connection terminal 8, permitting realization of the inner leads 5 having a further smaller size.

The inner leads 5, the die pad 2, and the external connection terminals 8 are desirably formed as a lead frame having a thickness of 50 µm or more and 80 µm or less, which is effective to further reduce the size of the inner lead 5 having the bend portion 10.

As illustrated in FIG. 2B, the lifted inner lead 5 includes a protruding shape portion 12 provided on one side in a signal lead width direction and an inclined vertical surface 13 provided on the other side, which is formed inwardly in the signal lead width direction.

The protruding shape portion 12 provided on the one side has an effect of expanding the bonding area. The protruding shape portion 12 provided on the one side may also serve as an anchor satisfying a pull strength of the external connection terminal 8 in a mounting bending strength test, to ensure a necessary share strength.

The inclined vertical surface 13 located on the other side is formed to minimize the amount of spacing between the inner lead 5 and the die pad 2. The inclined vertical surface 13 may be formed along each side of the die pad 2 to increase the degree of freedom of a layout to be disposed the sealing member 6 of the inner lead 5.

As illustrated in FIG. 2C, in the lifted inner lead 5, a cutaway portion 14 is formed along the bend portion 10 and the external connection terminal 8 on a side of the inclined vertical surface 13 which is formed inwardly in the signal lead width direction. The cutaway portion 14 allows a width of the external connection terminal 8 to be set to a value larger than that of a width of the inner lead upper surface portion 5a, to thereby increase a footprint on the mounting board, and hence a mounting strength in a case where soldering is performed on the mounting board may be ensured. A distance from the die pad exposure portion 7 may be increased by the sizes of the cutaway portion 14, the inner lead rear surface portion 5b, and the bend portion 10, and hence a short circuit between board mounting wiring patterns may be avoided.

As described above, the inner lead 5 may be formed as an extremely small-size inner lead which includes the protruding shape portion 12 provided on one side in the signal lead width direction, the inclined vertical surface 13 provided on the other side, which is formed inwardly in the signal lead width direction, and the vertical bend portion 10.

Next, the die pad 2 according to the embodiment of the present invention is described with reference to the attached drawings.

Figure 3:
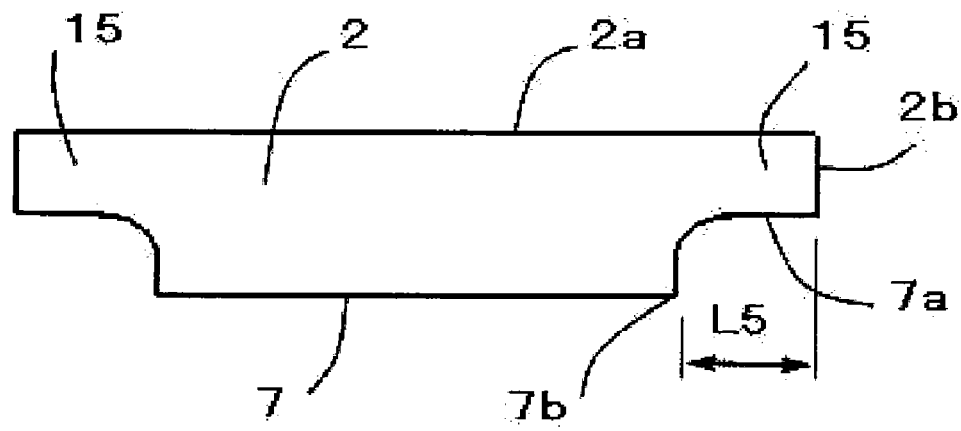
FIG. 3 is a side cross sectional view illustrating an example of a die pad according to the embodiment of the present invention.

FIG. 3 is a side cross sectional view illustrating an example of the die pad according to the embodiment of the present invention. A side surface portion of the die pad 2 includes thin portions 15 provided substantially parallel to a mounting surface 2a of the die pad 2. A protruding length L5 of each of the thin portions 15 may desirably be equal to a distance between the die pad exposure portion 7 corresponding to the bottom surface of the main body of the die pad 2 and a bottom surface 7a of each of the thin portions 15 or in a range of up to two times the distance.

With this configuration, even when the die pad exposure portion 7 and the external connection terminal exposure portion 9 are exposed, the die pad 2 may be reliably prevented from being separated from the sealing resin. In addition, the mounting surface 2a of the die pad 2 may be increased in area, and hence pads for connecting the bonding wires 4 to bonding portions located in peripheral regions of the mounting surface may be reliably provided.

Since a long protruding length L5 of each of the thin portions 15 makes the spacing between a bottom surface end portion 7b of the die pad 2 and a protruding end part of each of the thin portions 15, a wider spacing is left between the bottom surface end portion 7b of the die pad 2 and an end portion 9a of the external connection terminal exposure portion 9, securing a distance for avoiding a short circuit between mounting wiring patterns connected to the external connection terminal exposure portion 9, and minimizing the spacing between the inner lead 5 and the die pad 2.

Since the thin portions 15 of the die pad 2 are formed by rolling, the thin portions 15 can be easily and reliably provided without bending the die pad 2, permitting secure assignment of expanse and flatness to the mounting surface 2a.

A thickness of the thin portions 15 is desirably in a range of approximately 20% to approximately 90% of a thickness of the main body of the die pad 2. Thus, a difference in height between the bottom surface of the main body of the die pad 2 and the bottom surface of each of the thin portions 15 is in a range of approximately 10% to approximately 80% of the thickness of the main body of the die pad 2.

A distance between a side of a thin tip end portion 2b of the die pad 2 and the inclined vertical surface 13 of the lifted inner lead 5 is shorter than the thickness of the die pad 2. Note that the distance between the side of the thin tip end portion 2b of the die pad 2 and the inclined vertical surface 13 of the lifted inner lead 5 is desirably in a range of 30 µm or more and 80 µm or less.

Figure 4:
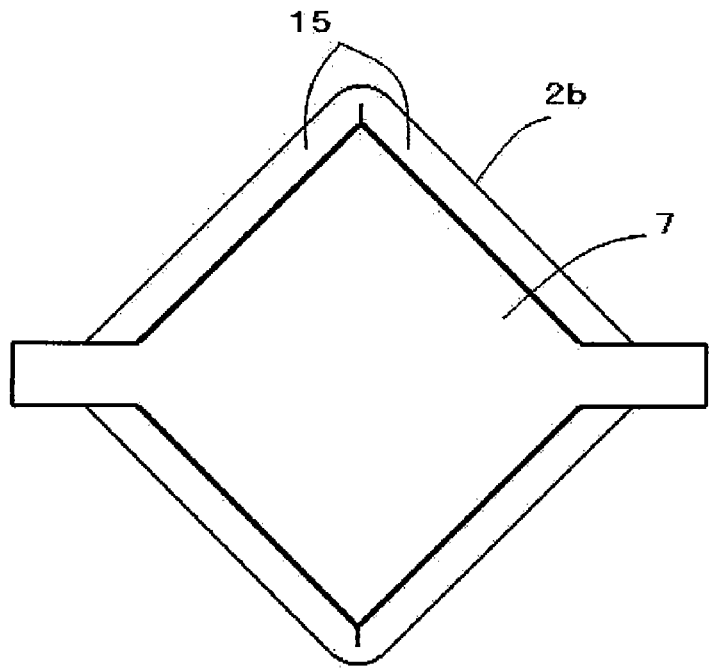
FIG. 4 is a bottom view illustrating the example of the die pad according to the embodiment of the present invention.

In FIG. 4, which is a bottom view illustrating the die pad 2, the thin portions 15 which are located in the side surface portions (thin tip end portions) 2b of the die pad 2 and substantially parallel to the mounting surface 2a of the die pad are formed as a pair of thin portions 15 each of which is linked to two sides of the side surface portion 2b of the die pad 2.

Since the thin portions 15 of the die pad 2 are formed to have parallel sides serve as a pair and the all sides have the same length, the thin portions 15 can be easily and reliably formed by rolling without bending the die pad 2, permitting secure assignment of expanse and flatness to the mounting surface. A sealing resin material filling region on the bottom surfaces of the thin portions 15 is further increased in area.

Figure 5A:
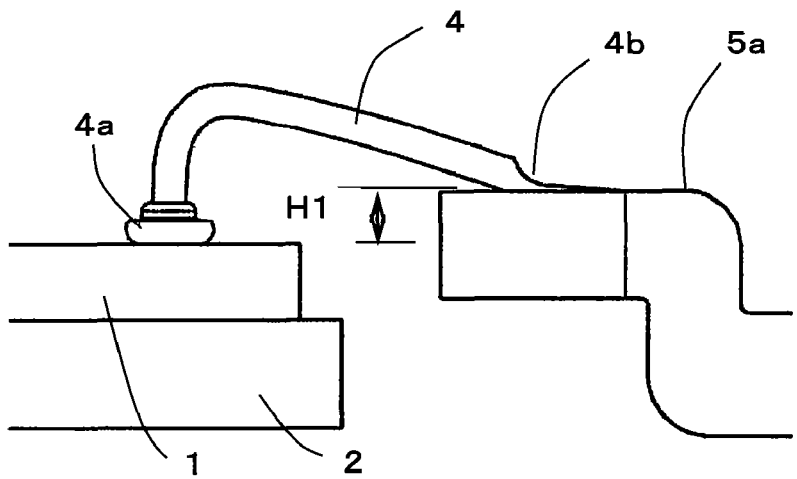
Figure 5B:
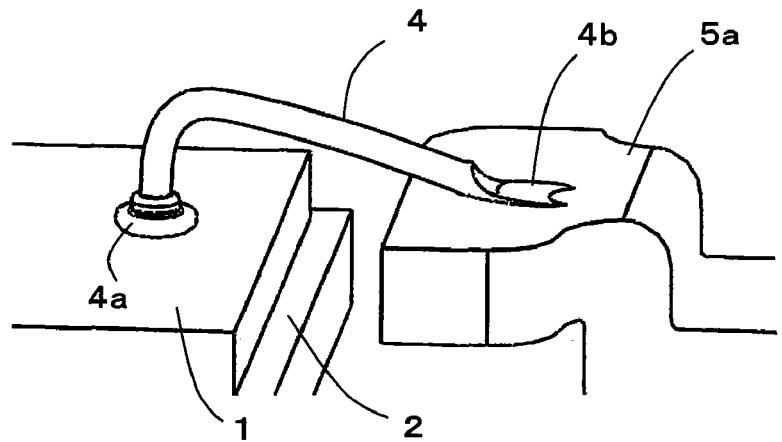
Figure 5C:
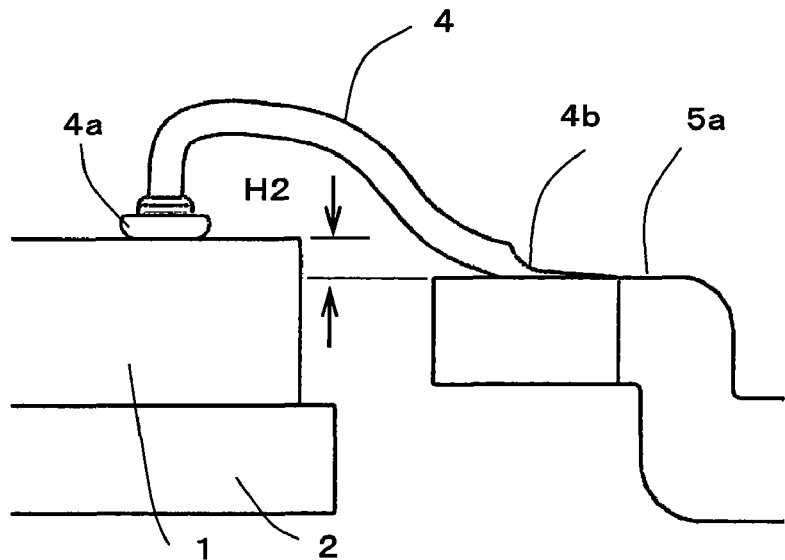

FIGS. 5A, 5B, and 5C illustrate examples of a wire loop. FIGS. 5A and 5B are a side view and a perspective view, respectively, each illustrating a case where the thickness of the semiconductor element is smaller than the thickness of the die pad or the inner lead. The semiconductor element 1 is mounted on the die pad 2, and the inner lead 5 opposed to the bonding pad on the surface of the semiconductor element 1 is connected to the bonding pad through the bonding wire 4. Since the height of the rear surface of the inner lead 5 is equal to or higher than the height of the upper surface of the die pad 2, the upper surface portion 5a of the lifted inner lead 5 is formed to have a height higher than that of the upper surface of the semiconductor element 1 mounted on the die pad 2, by a length H1. One end of the bonding wire 4 is a first bond 4a on the bonding pad provided on the surface of the semiconductor element 1, and the other end thereof is a second bond 4b in the bonding area of the upper surface portion 5a of the inner lead 5. When the second bond 4b is formed by "uphill bonding" so that the second bond 4b is made higher in position than the first bond 4a, an electrical short circuit due to contact between the upper end portion of the semiconductor element 1 and the bonding wire 4 may be avoided even in a case where a loop height of the bonding wire 4 is suppressed to a lower value. In this embodiment, the semiconductor element is illustrated as 50 µm in thickness and each of the die pad and the inner lead is illustrated as 80 µm in thickness.

Since the difference in height between the upper surface of the semiconductor element 1 and the upper surface portion 5a of the inner lead 5 is easily maintained, the inner lead 5 may be brought close to the side of the thin tip end portion 2b of the die pad 2, permitting reduction of the loop length and the loop height of the bonding wire 4. Thus, the wire loop between the semiconductor element 1 and the inner lead 5 may be formed into a suitable shape at a minimum length, and hence a device size and a device outline height may be reduced.

FIG. 5C is a side view illustrating a case where the thickness of the semiconductor element is larger than the thickness of the die pad or the inner lead. The semiconductor element 1 is mounted on the die pad 2, and the inner lead 5 opposed to the bonding pad on the surface of the semiconductor element 1 is connected to the bonding pad through the bonding wire 4. A height of the rear surface of the inner lead 5 is equal to or higher than a height of the upper surface of the die pad 2. However, the semiconductor element is thick (for example, 150 µm), and hence the upper surface portion 5a of the lifted inner lead 5 is formed so that the height thereof is lower than the height of the upper surface of the semiconductor element 1 mounted on the die pad 2, by a length H2.

One end of the bonding wire 4 is the first bond 4a on the bonding pad provided on the surface of the semiconductor element 1, and the other end thereof is the second bond 4b in the bonding area of the upper surface portion 5a of the inner lead 5. The second bond 4b is formed by "downhill bonding", so that the second bond 4b is made higher in position than the first bond 4a, but the height of the rear surface of the inner lead 5 is equal to or higher than the height of the upper surface of the die pad 2, and hence a large loop height is not necessary. In the conventional technology, the height of the upper surface of the die pad and the height of the upper surface of the inner lead are equal to each other, and hence the loop height is increased to avoid the electrical short. In this embodiment, however, even in the case of "downhill bonding", since the second bond 4b is located at the height equal to or higher than the thickness of the inner lead, the difference in height between the first bond 4a and the second bond 4b is small, avoiding an electrical short circuit between the upper end portion of the semiconductor element 1 and the bonding wire 4, even when the loop height of the bonding wire 4 is suppressed to a lower value.

Next, a suitable configuration for reducing the inner leads 5 and the die pad 2 in size according to the embodiment of the present invention is described.

Figure 6:
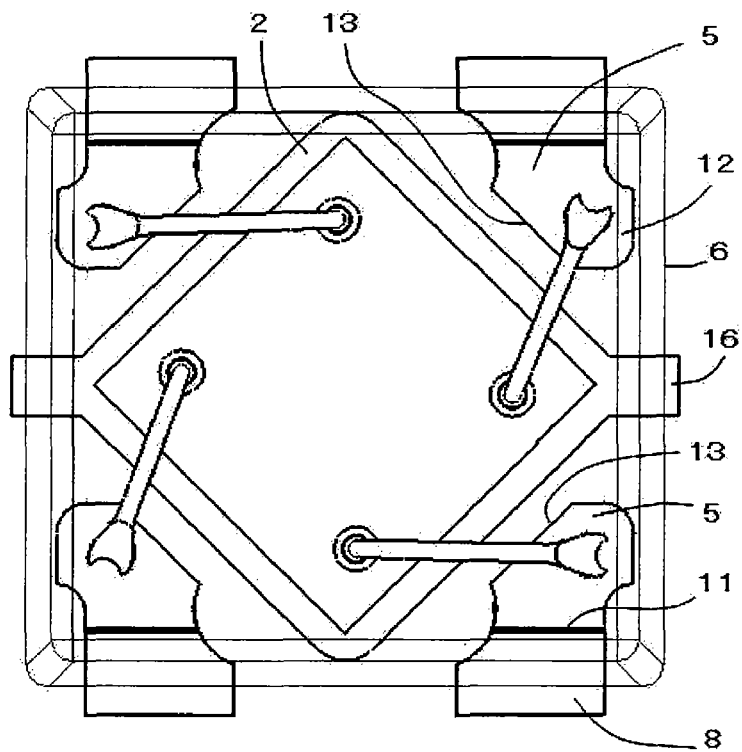
FIG. 6 is a plan view illustrating an example of a configuration for inner leads and the die pad according to the embodiment of the present invention.

FIG. 6 is a plan view illustrating an example of a configuration for the inner leads and the die pad according to the embodiment of the present invention. The protruding shape portion 12 located on one side of each of the lifted inner leads 5 is provided toward the outside of the sealing member 6. The inclined vertical surface 13 located on the other side of each of the lifted inner leads 5 is formed toward the inside of the sealing member 6. Accordingly, the layout in the sealing member 6 may be efficiently designed with a degree of freedom.

As illustrated in FIGS. 1A and 1B, the vertical shape portions 11 of the bend portions 10 are provided so that the surfaces thereof are parallel to the sides of the sealing member 6. The bend portions 10 of the inner leads 5 are stably and easily formed. In addition, the vertical shape portions 11 may be made parallel to the shape of mounting wiring patterns to be connected to the lower surface portion (bottom surface portion) of the external connection terminal 8, so that efficient board mounting is achieved.

As illustrated in FIG. 6, the inclined vertical surfaces 13 formed inwardly in the signal lead width direction are opposed and in parallel to the sides of the die pad 2.

Since the surfaces of the vertical shape portions 11 of the bend portions 10 are located parallel to the sides of the sealing member 6, and the inclined vertical surfaces 13 formed inwardly in the signal lead width direction are opposed and in parallel to the sides of the die pad 2, inner leads 5 are provided with a degree of freedom along the respective sides of the die pad 2 in the four corner spaces of the sealing member 6 with high efficiency. There is also an effect of minimizing the distance between the inner leads 5 and the die pad 2. As a result, the sealing member 6 may be reduced in size.

In the die pad 2, at least a pair of hanger pin shape portions 16 are formed from vertex portions of the sides of the die pad 2, which extend to the sides of the sealing member 6 in the same thickness as the die pad 2. The lifted inner leads 5 are disposed in substantially central portions of the respective sides of the die pad 2 at a distance smaller than the thickness of the die pad 2. With this configuration, the use of the sealing resin material in the four corner spaces of the sealing member 6 is maximized, and hence the size of the die pad 2 may be maximized. The lifted inner leads 5 are disposed to sandwich the at least a pair of hanger pin shape portions 16 formed in the vertex portions of the sides of the die pad 2. The lifted inner leads 5 are provided to sandwich the at least a pair of hanger pin shape portions 16 formed in the vertex portions of the sides of the die pad 2, and hence regions under the bottom surfaces of the thin portions 15 of the die pad 2 and the rear surfaces of the inner leads 5 are efficiently filled with the sealing resin material in the four corner spaces of the sealing member 6.

Figure 7:
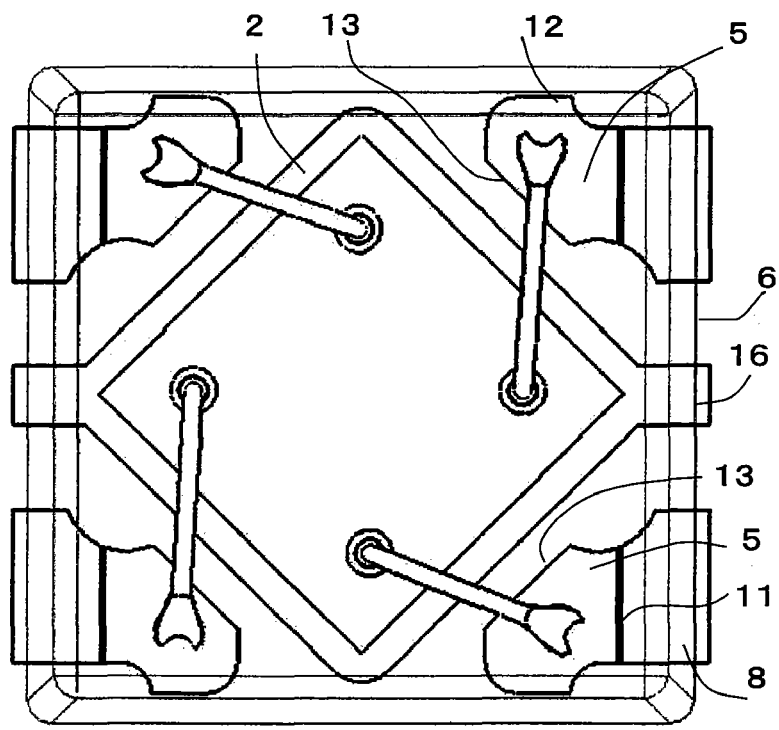
FIG. 7 is a plan view illustrating another example of the configuration for the inner leads and the die pad according to the embodiment of the present invention.

FIG. 7 is a plan view illustrating another example of a configuration for the inner leads and the die pad according to the embodiment of the present invention. In this example, the external connection terminals 8 are disposed to sandwich the at least a pair of hanger pin shape portions 16 formed in the vertex portions of the sides of the die pad 2. Even when the inner leads 5 and the external connection terminals 8 are disposed as described above, the regions under the bottom surfaces of the thin portions 15 of the die pad 2 and the rear surfaces of the inner leads 5 are efficiently filled with the sealing resin material in the four corner spaces of the sealing member 6. When such a configuration is employed, the bottom surface of the die pad is also relatively increased in area, and hence mounting efficiency (chip area/package occupying area) in mounting on a semiconductor device board of which a die pad occupying area ratio is equal to or larger than 30% may be increased, and heat may be efficiently radiated from the exposure portion on the bottom surface of the die pad.

Next, a recommended pad layout which is an example of board mounting wiring is described, and then how to avoid short circuit between board mourning wiring patterns is described.

Figure 8:
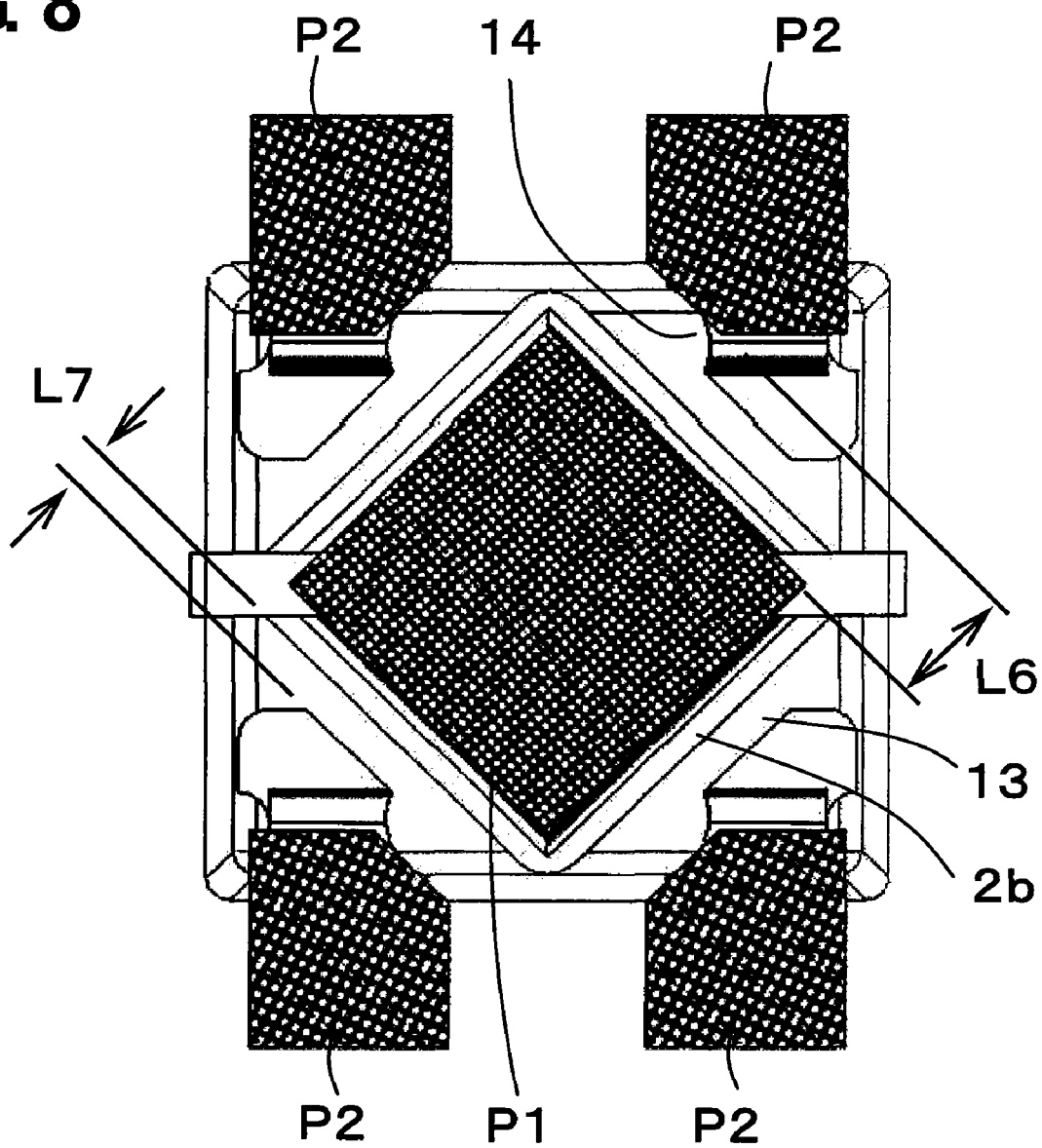
FIG. 8 illustrates an example of a wiring pattern in mounting on a board of the resin-sealed semiconductor device according to an embodiment of the prevent invention, which is a bottom view for illustrating only the wiring pattern in mounting on the board and a positional relationship thereof with respect to a board mounting surface of the resin-sealed semiconductor device.

FIG. 8 illustrates an example of a board mounting wiring pattern for the resin-sealed semiconductor device according to the embodiment of the present invention. FIG. 8 is a bottom view illustrating only the board mounting wiring pattern and a positional relationship thereof with respect to a board mounting surface of the resin-sealed semiconductor device.

A board mounting wiring pattern P1 on the bottom surface of the die pad is provided as being separated from each of board mounting wiring patterns P2 on the bottom surfaces of the external connection terminals 8, with a spacing L6 provided therebetween. The spacing L6 is wider than a spacing L7 between the inclined vertical surface 13 of each of the inner leads 5 and the side surface portion 2*b* of the die pad 2. The spacing L7 between the inclined vertical surface 13 of each of the inner leads 5 and the side surface portion 2*b* of the die pad 2 is increased in width to the spacing L6 between the board mounting wiring pattern P1 on the die pad 2 and each of the board mounting wiring patterns P2 on the external connection terminals 8 due to the shapes of the bend portion 10, the vertical shape portion 11, the inclined vertical surface 13, and the cutaway portion 14 in each of the inner leads 5 and to the shape of each of the thin portions 15 of the die pad 2.

Accordingly, a very small resin-sealed semiconductor device may be provided in which the mounting efficiency in semiconductor device board mounting is improved and the spacing between each of the inner leads and the die pad is minimized while avoiding the short circuit between the board mounting wiring patterns.

Next, a resin-sealed semiconductor device and a method of manufacturing the resin-sealed semiconductor device according to the embodiment of the present invention are described.

Figure 9:
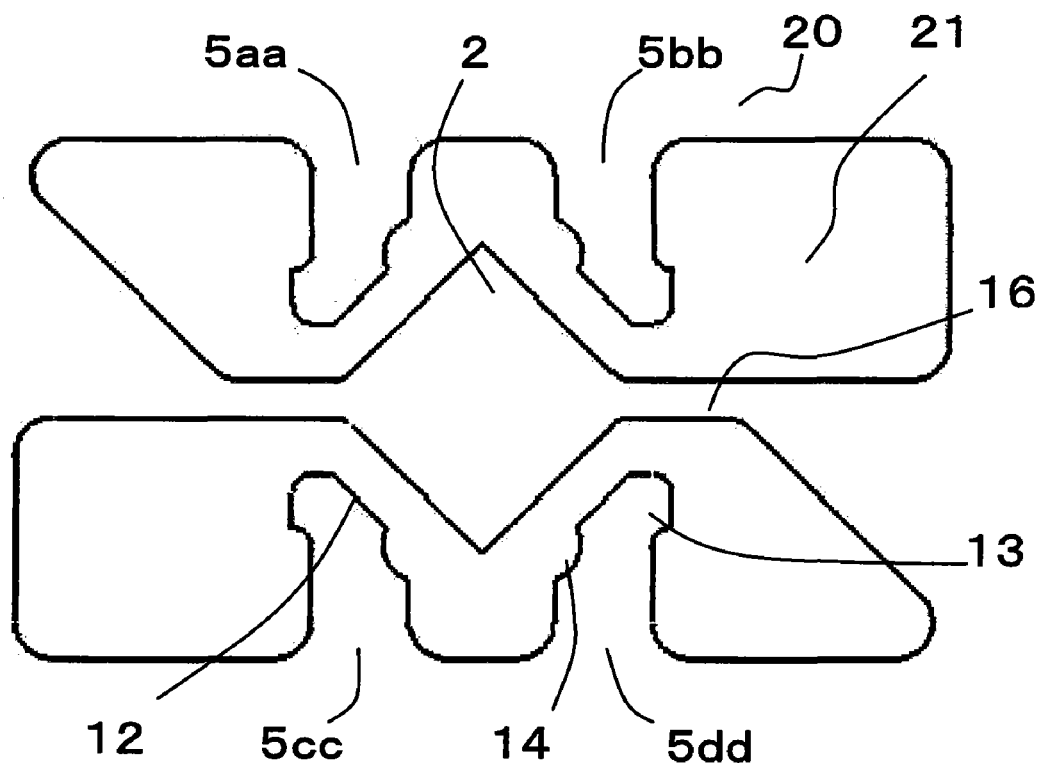
FIG. 9 is a plan view illustrating an example of a lead frame according to the embodiment of the present invention.

FIG. 9 is a plan view illustrating an example of a lead frame according to the embodiment of the present invention.

A lead frame 20 is a plate which is made of, for example, a copper (Cu) based alloy and has a thickness in a range of 50 μm to 80 μm, and includes a lead frame opening portion 21 provided in a region in which the semiconductor element 1 is to be mounted. The die pad 2 in a substantially quadrilateral shape for supporting the semiconductor element 1 disposed in the lead frame opening portion 21 is formed in the lead frame opening portion 21. A first signal lead 5*aa* and a second signal lead 5*bb* extend from a first edge side of the lead frame opening portion 21 to the first and second sides of the die pad 2. A third signal lead 5*cc* and a fourth signal lead 5*dd* extend from a second edge side opposed to the first edge side of the lead frame opening portion 21 to the opposed third and fourth sides of the die pad 2. The first signal lead 5*aa*, the second signal lead 5*bb*, the third signal lead 5*cc*, and the fourth signal lead 5*dd* are formed by pressing, in the four circumferential sides of the die pad 2. The protruding shape portions 12, the inclined vertical surfaces 13, the cutaway portions 14, and the hanger pin shape portions 16 are formed by simultaneous pressing, in the central portions of the signal leads which serves as the inner leads 5. The die pad 2 is supported by the hanger pin shape portions 16.

As described above, the die pad 2, the hanger pin shape portions 16, the first signal lead 5*aa*, the second signal lead 5*bb*, the third signal lead 5*cc*, and the fourth signal lead 5*dd* are formed in the lead frame opening portion 21 of the lead frame 20, and the shapes of the protruding shape portions 12, the inclined vertical surfaces 13, and the cutaway portions 14 are formed by pressing.

Figure 10A:
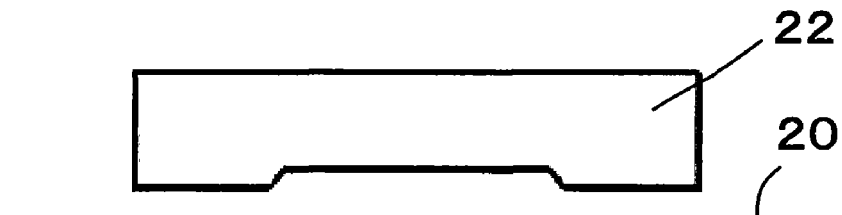
Figure 10B:
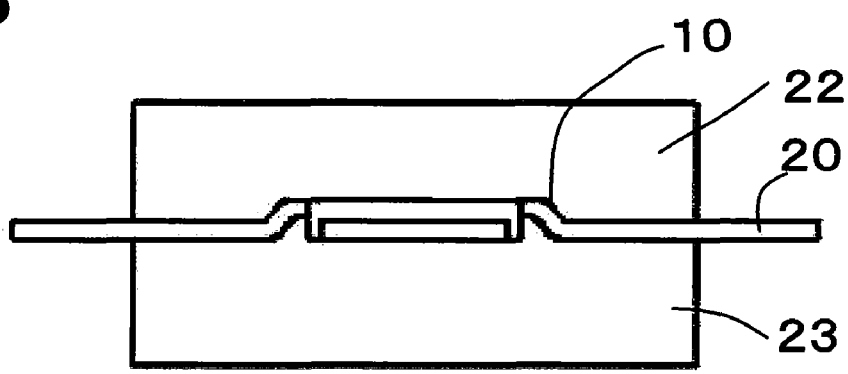
Figure 10C:
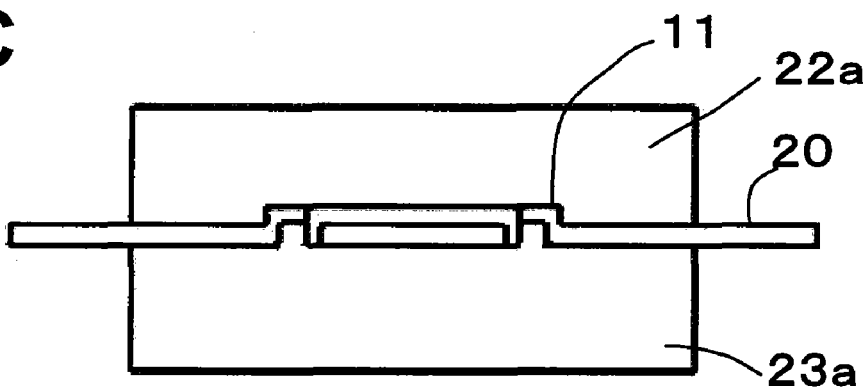
Figure 10D:
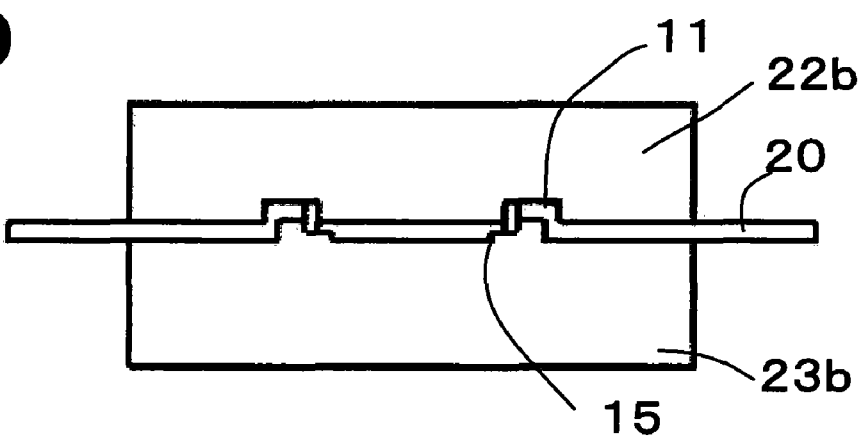

FIGS. 10A to 10D each illustrate an example of the method of manufacturing the resin-sealed semiconductor device according to the embodiment of the present invention. FIGS. 10A to 10D are mold cross sectional views illustrating steps of forming the bend portions and the thin portions a process of preparing the lead frame. FIG. 10A is a configuration view illustrating an upper bend formation mold, a lower bend formation mold, and the lead frame. FIG. 10B illustrates a press state in which the bend portions are formed by the upper bend formation mold and the lower bend formation mold. FIG. 10C illustrates a press state in which the vertical shape portions are formed by an upper bend formation mold and a lower bend formation mold which are used to form the vertical shape portions. FIG. 10D illustrates a press state in which the thin portions of the die pad are formed by an upper thin portion formation mold and a lower thin portion formation mold which are used to form the thin portions.

A process for preparing the lead frame in the manufacturing method according to the present invention, which corresponds to a step of forming the bend portions 10 and a step of providing the thin portions 15 in the side surface portion of the die pad 2, is described with reference to the examples illustrated in the mold cross sectional views of FIG. 10.

FIG. 10A illustrates a state in which an upper bend formation mold 22 is located on the upper side, a lower bend formation mold 23 is located on the lower side, and the read frame 20 illustrated in FIG. 9 is located in the center.

In the step illustrated in FIG. 10A, the lead frame 20 in which the protruding shape portions 12, the inclined vertical surfaces 13, the cutaway portions 14 in the inner leads 5, the die pad 2, and the hanger pin shape portions 16 are formed is prepared between the upper bend formation mold 22 and the lower bend formation mold 23.

FIG. 10B illustrates a press state in which the lead frame 20 is bent by the upper bend formation mold 22 located on the upper side and the lower bend formation mold 23 located on the lower side, to thereby form schematic shapes of the bend portions 10.

The step illustrated in FIG. 10B is defined as an lifted step of forming the shapes of the bend portions 10. In this step, upper surface parts of tip end portions of the signal leads 5aa, 5bb, 5cc, and 5dd are clamped by the upper bend formation mold 22 and rear surface parts thereof are clamped by the lower bend formation mold 23. The signal leads 5aa, 5bb, 5cc, and 5dd are lifted by clamp forces capable of holding two-dimensional positions, and the inner leads 5 are stretched between the signal leads 5aa, 5bb, 5cc, and 5dd and the external connection terminals 8.

FIG. 10C illustrates a press state in which an upper bend formation mold 22a located on the upper side and a lower bend formation mold 23a located on the lower side are used to change the schematic shapes of the bend portions 10 into the vertical shape portions 11.

The step illustrated in FIG. 10C is defined as a step of forming the vertical shape portions 11. In the formation of the vertical shape portions 11, arc shape parts of the bend portions 10 are bent by the upper bend formation mold 22a and the lower bend formation mold 23a each having a rounded part whose curvature radius is close to 0. In this embodiment, the curvature radius (R) is not larger than 10 μm. In this case, the lead frame 20 having a thickness in a range of 50 μm to 80 μm is used and the vertical shape portions 11 are formed so that the curvature radius of the arc shape parts of the bend portions 10 is equal to or smaller than 10 μm. An angle of the vertical shape portions 11 includes a range of 85° to 90° relative to the external connection terminal exposure portions 9. In this embodiment, the vertical shape portions thus formed are further stretched between the inner leads 5 and the external connection terminals 8, and hence the vertical shape portions 11 are thinner than the lead frame 20 by 10% to 50% of a thickness of the lead frame 20.

In the step illustrated in FIG. 10C, as illustrated in FIG. 2A, the length L1 of the flat upper surface portions of the lifted inner leads 5 is set to the value larger than that of the length L2 of the flat rear surface portions thereof, and the length L3 of the flat lower surface portions of the external connection terminals 8 is set to the value larger than that of the length L4 of the flat upper surface portions thereof. Accordingly, the necessary area of the flat portions of the inner leads 5 which serve as the connection regions of the bonding wires 4, the necessary area of the flat upper surface portions for forming the sealing member 6, of the external connection terminals 8, and the necessary area of the flat rear surface portions of the external connection terminals 8 are secured.

FIG. 10D illustrates a press state in which an upper thin portion formation mold 22b located on the upper side and a lower thin portion formation mold 23b located on the lower side are used to form the thin portions 15 of the die pad 2.

The step illustrated in FIG. 10D is defined as a step of forming the thin portions 15. The side surface portion of the die pad 2 is rolled using the upper thin portion formation mold 22b and the lower thin portion formation mold 23b to form the thin portions 15 in substantially parallel to the mounting surface of the die pad 2. The thin portions 15 are provided as a pair of thin portions each of which is linked to the two sides of the side surface portion of the die pad in substantially parallel to the mounting surface of the die pad. The thin portions of the die pad 2 are formed by rolling so that the parallel sides serve as a pair and the sides have the same length.

The steps illustrated in FIGS. 10B, 10C, and 10D, which are included in the process for preparing the lead frame illustrated in FIG. 10 may be simultaneously performed as a single step or each may be performed as a plurality of steps.

Figure 11A:
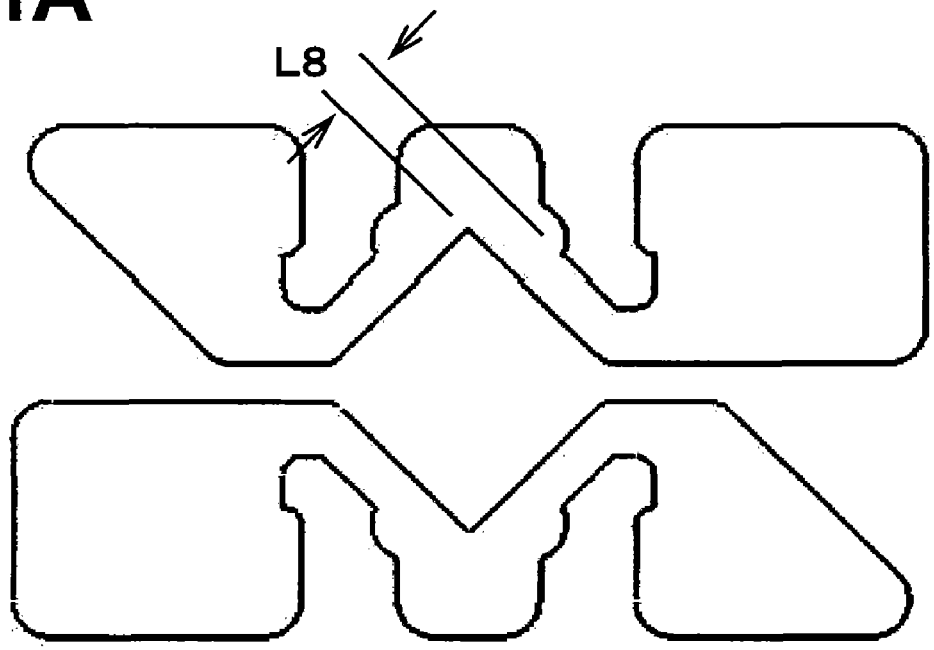
Figure 11B:
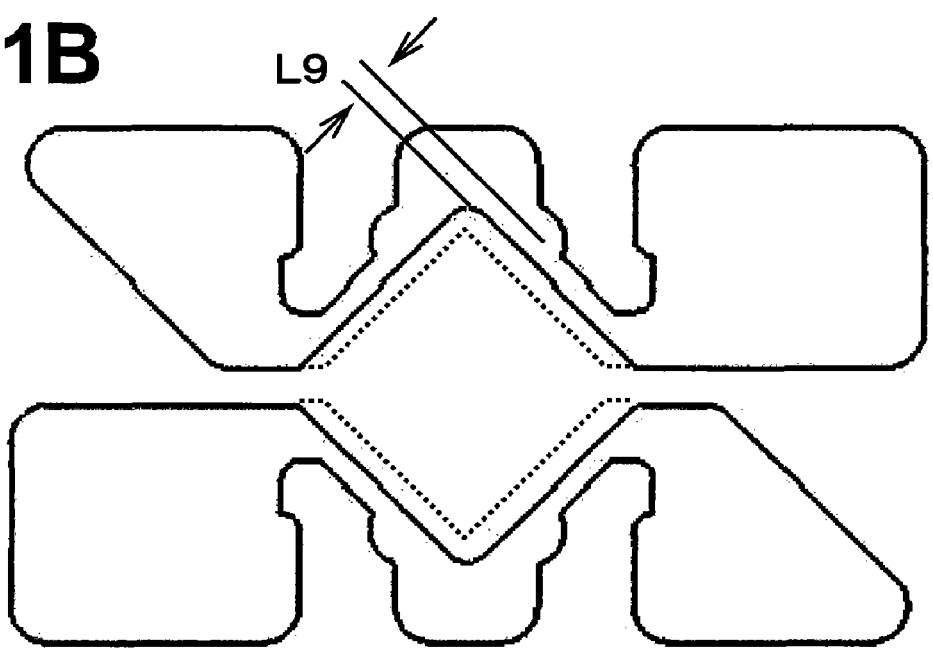

FIGS. 11A and 11B are plan views illustrating an example of formation of thin portions of the die pad 2 for size comparison. FIG. 11A is a plan view before the formation of the thin portions of the die pad, and FIG. 11B is a plan view after the formation of the thin portions thereof.

As illustrated in FIGS. 11A and 11B, after the formation of the thin portions, the size of the die pad 2 is increased by rolling using the lower thin potion formation mold 23b in the step illustrated in FIG. 10D, increasing the area of the mounting surface of the die pad 2, to thereby reduce a distance between the die pad 2 and the inclined vertical surfaces of the lifted inner leads 5 from L8 of FIG. 11A to L9 of FIG. 11B. This exhibits an effect of increasing the mounting surface of the die pad 2 in area and reducing the resin-sealed semiconductor device in size.

In this manner, in the case of the lead frame 20, the bend portion 10, the vertical shape portion 11, the protruding shape portion 12, the inclined vertical surface 13, and the cutaway portion 14 are formed in the lifted inner lead 5 as illustrated in FIGS. 2A, 2B, and 2C, and the thin portion 15 and the hanger pin shape portions 16 are formed in the die pad 2.

Next, the resin-sealed semiconductor device and the method of manufacturing the resin-sealed semiconductor device according to the embodiment of the present invention in the case where the lead frame 20 having the structure as described above is used are described.

The semiconductor element 1 illustrated in FIGS. 1A and 1B has a structure in which a semiconductor substrate made of, for example, single-crystalline silicon and wiring layers formed on the semiconductor substrate are principal components, and is two-dimensionally formed into a square shape. A circuit system is mounted on the semiconductor element 1. The circuit system includes the semiconductor element 1 formed on a principal surface of the semiconductor substrate and wirings formed in the wiring layers. Three or four electrodes are formed on a circuit formation surface of the semiconductor element 1 along the respective circumferential sides of the semiconductor element 1. The three or four electrodes are formed in an uppermost wiring layer of the wiring layers of the semiconductor element 1, and electrically connected through wirings to the semiconductor element 1 included in the circuit system. Each of the three or four electrodes is formed of, for example, an aluminum film or an aluminum alloy film.

In the step of mounting the semiconductor element 1 on the lead frame 20, the bonding material 3 for mounting the semiconductor element 1 is applied from, for example, a dispenser to the die pad 2. The semiconductor element 1 is held through vacuum-sucking of a surface side thereof by, for example, a collet. While the semiconductor element 1 is held, the collet is moved to a predetermined position to feed the semiconductor element 1 to the die pad 2, and hence the bonding material 3 applied from the dispenser to the die pad 2 is spread on the die pad 2. Then, the bonding material 3 is cured by heating, so that the semiconductor element 1 is fixedly bonded to the die pad 2 and mounted thereon.

Next, in the step of electrically connecting the semiconductor element 1 and the inner leads 5 to each other through the bonding wires 4, the inner leads 5 formed of the first to fourth signal leads 5aa, 5bb, 5cc, and 5dd are electrically connected to the three or fourth electrodes formed on the circuit formation surface of the semiconductor element 1 through the conductive bonding wires 4. For example, a gold (Au) wire is used as each of the bonding wires 4. For example, a bonding method using both thermocompression bonding and ultrasonic vibration is used as a connection method for the bonding wires 4.

Hereinafter, a wire bonding process for the semiconductor device described above is described in detail.

Referring to FIG. 5A, a gold ball having a diameter of approximately 60 μm, which is larger than a diameter of the central hole, is formed in a tip end of the bonding wire 4 inserted into a central hole of a substantially cylindrical capillary serving as a bonding tool. The capillary is moved to press the gold ball onto a first bonding pad of the semiconductor element 1 by a predetermined pressure. Then, ultrasonic vibration and heating are applied through the capillary to fixedly bond the metal ball onto the surface of the first bonding pad (first bond 4a). The capillary is moved upward in the vertical direction at the position of the first bonding pad. The capillary is moved to the inner lead 5 side in the lateral direction, and the bonding wire 4 is bent at a portion of a recrystallization region. The capillary is moved downward to be pressed to the bonding area of the inner lead 5a by a predetermined pressure, and ultrasonic vibration and thermocompression bonding are performed to stitch-bond the wire bonding 4 to the surface of the inner lead 5a (second bond 4b). The bonding wire 4 is clamped by a clamper, and the capillary is moved upward, to thereby cut the bonding wire 4. As a result, the other end side of the bonding wire 4 is connected to the tip end portion of the inner lead 5 of each of the signal leads 5aa, 5bb, 5cc, and 5dd by thermocompression bonding using the capillary. A wire loop having a short length and a low height is formed between the inner lead 5 and each of the three or fourth electrodes formed on the circuit formation surface of the semiconductor element 1.

When "uphill bonding" is performed in which the position of the second bond 4b is higher than the position of the first bond 4a, the loop height is minimized and the height difference between the upper surface of the semiconductor element 1 and the upper surface portion of the inner lead 5 is easily held, and hence the risk of electrical short circuit therebetween may be reduced.

Figure 12A:
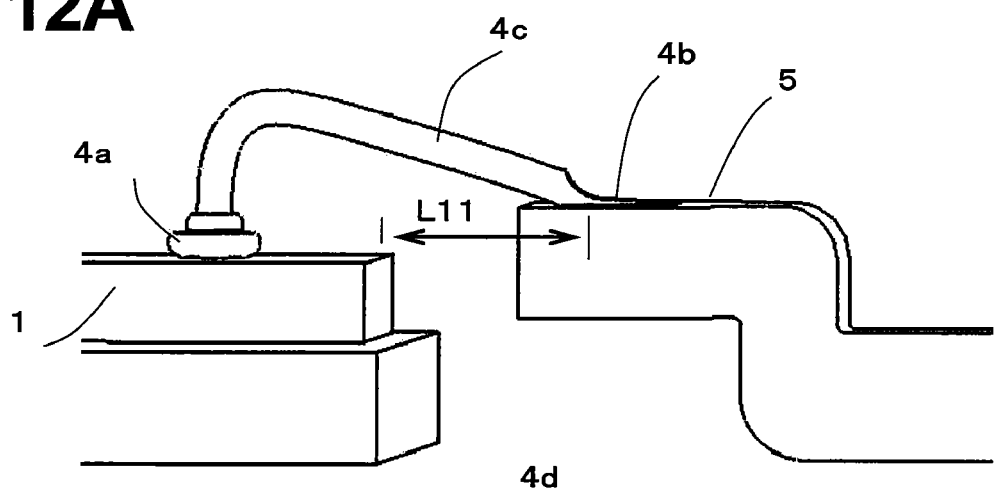
Figure 12B:
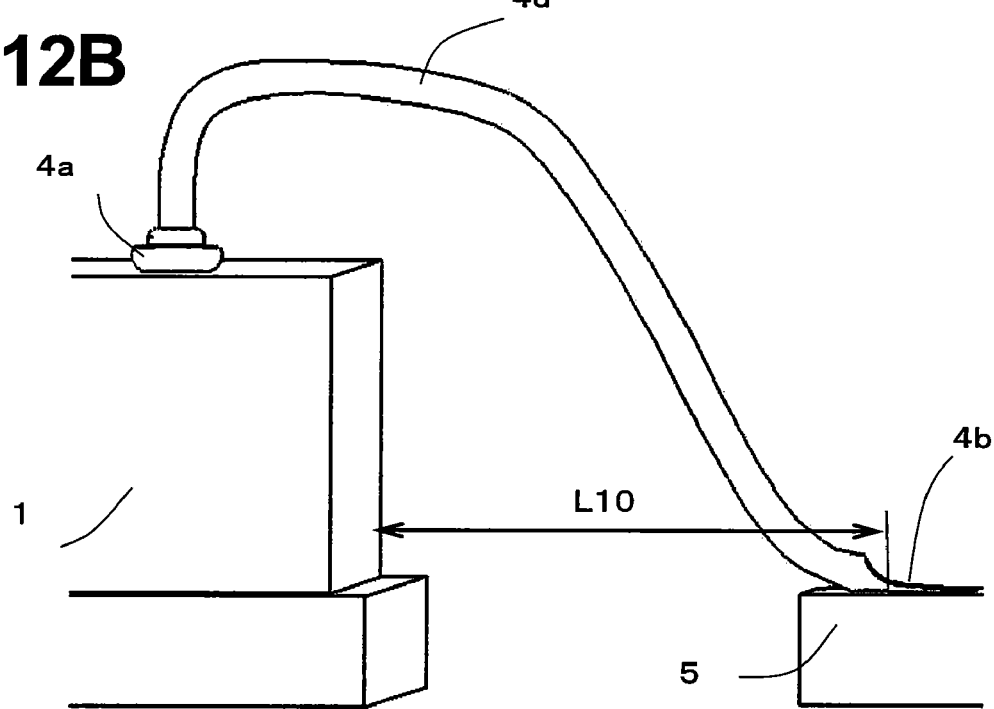

FIGS. 12A and 12B are perspective views illustrating an example of the wire loop according to the embodiment of the present invention in comparison to a conventional wire loop. FIG. 12A is a side view illustrating the example of the wire loop according to the embodiment, and FIG. 12B is a side view illustrating the conventional wire loop. When the bonding wire 4 are compared with the conventional example with respect to the loop length and the loop height, as illustrated in FIG. 12B, a loop of a conventional bonding wire 4d is formed by "downhill bonding", and hence it is inevitable to increase the loop height and the loop length to avoid electrical contact with an end of the semiconductor element 1. In contrast to this, as illustrated in FIG. 12A, the loop of a bonding wire 4c is formed short and low by "uphill bonding". Accordingly, a distance L11 between the second bond 4b of the inner lead 5 and the semiconductor element 1 is shorter than a conventional distance L10, and hence the short and low loop may be obtained.

After that, in the sealing step, the semiconductor element 1, the die pad 2, the inner leads 5 of the signal leads 5aa, 5bb, 5cc, and 5dd, and the bonding wires 4 are sealed with the sealing member 6 made of an insulating resin. A surface of an end portion of each of the four signal leads, namely, the first to fourth signal leads 5aa, 5bb, 5cc, and 5dd is partially exposed at the lower surface of the sealing member 6 to form the external connection terminal 8.

The sealing member 6 is two-dimensionally formed into a square shape. The sealing member 6 is made of a biphenyl-based insulating resin added with, for example, phenyl-based curing agent, silicone rubber, and filler in order to achieve low stress. A transfer molding method suitable for mass production as such a kind of sealing method is a method in which a molding die including a pot, a runner, an inflow gate, and a cavity is used, and an insulating resin is injected from the pot to the cavity through the runner and the inflow gate by the application of pressure, to thereby form the sealing member 6.

Figure 13:
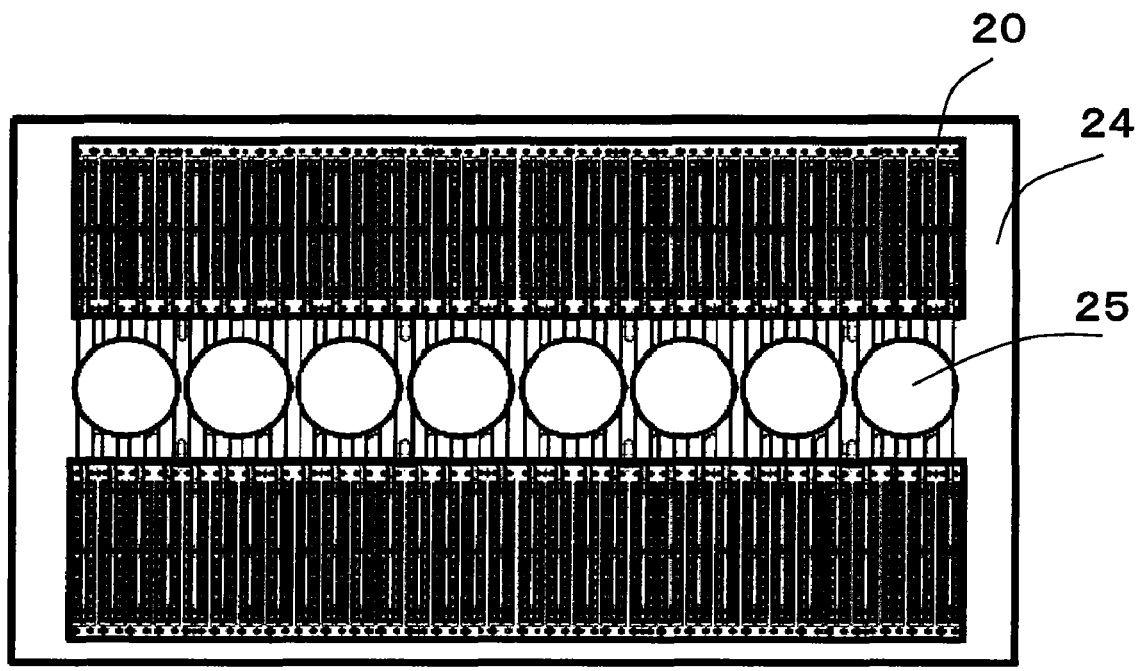
FIG. 13 is a plan view illustrating an example of a molding manufacturing method for the resin-sealed semiconductor device according to the embodiment of the present invention.
Figure 14A:
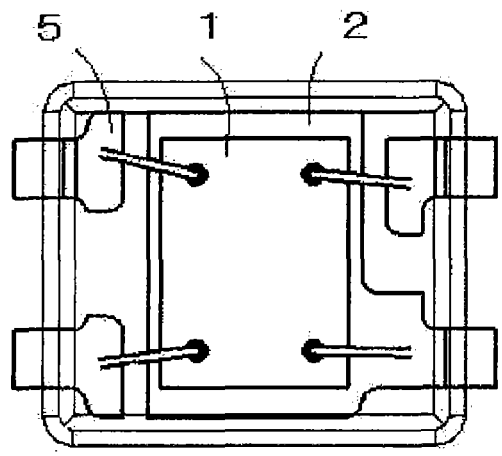
FIGS. 14A, 14B, and 14C each are a plan view, a side view, and a perspective view, respectively, illustrating a conventional resin-sealed semiconductor device.
Figure 14B:
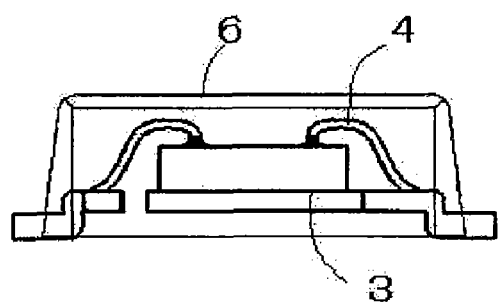
Figure 14C:
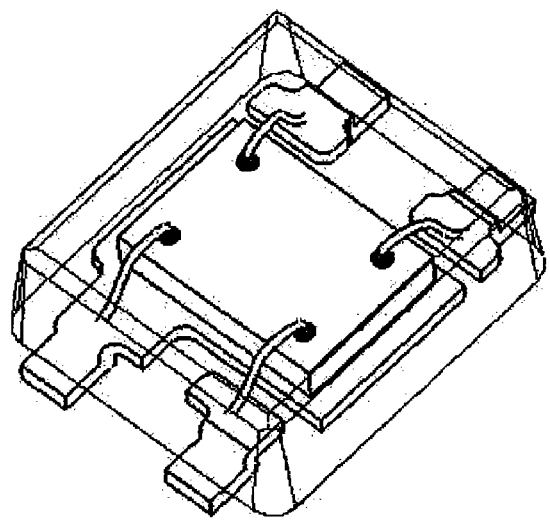
Figure 15:
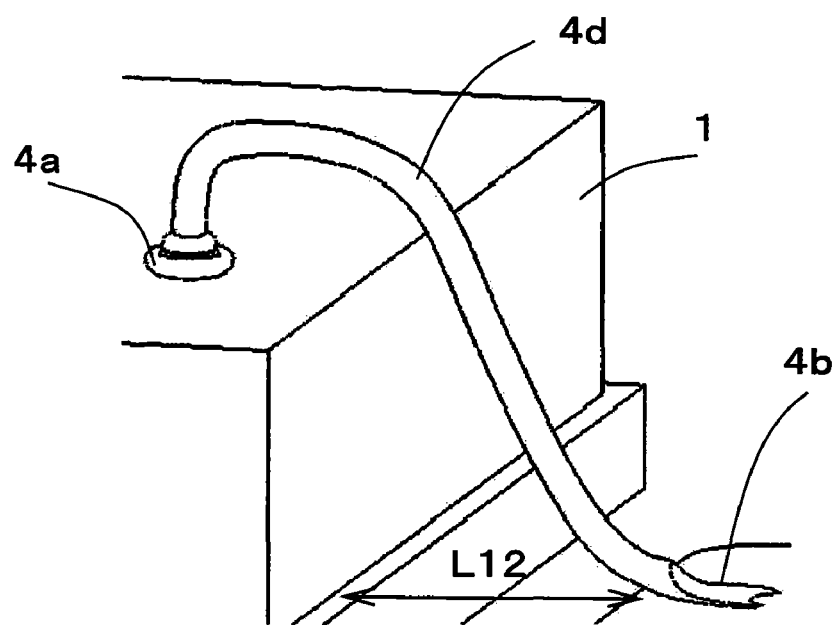
FIG. 15 is a perspective view illustrating an example of a wire loop of the conventional resin-sealed semiconductor device.

FIG. 13 is a plan view illustrating an example of a molding manufacturing method for the resin-sealed semiconductor device according to the embodiment of the present invention. As illustrated in FIG. 13, the lead frame 20 is disposed between an upper mold and a lower mold of a molding die 24 so that the semiconductor element 1, the bonding wires 4, and the inner leads 5 of the signal leads 5aa, 5bb, 5cc, and 5dd are located in a cavity defined by the upper mold and the lower mold. After that, the lead frame 20 is clamped by the upper mold and the lower mold. Next, resin tablets are put into pots 25 of the molding die 24. Then, the resin tablets are applied with pressure by a plunger of a transfer mold apparatus to supply resins to the cavity, to thereby form the sealing member 6. As a result, the semiconductor element 1, the bonding wires 4, and the inner leads 5 of the signal leads 5aa, 5bb, 5cc, and 5dd are sealed with the sealing member 6. After that, the lead frame 20 is taken out from the molding die 24.

Next, a runner located outside the sealing member 6 is removed, and then the lead frame 20 is solder-plated. Then, in a step of separating the resin-sealed semiconductor device from the main body of the lead frame 20, the signal leads 5aa, 5bb, 5cc, and 5dd are separated as the external connection terminals 8 from the lead frame 20 by cutting, to obtain the resin-sealed semiconductor device.

In the specific example of the resin-sealed semiconductor device according to this embodiment, which is reduced in size, a resin package size is 0.8 mm×0.8 mm, a die pad mounting surface size is 0.44 mm×0.44 mm (die pad occupying area ratio is equal to or larger than 30%), and a thickness is 0.3 mm. Thus, a resin-sealed semiconductor device having a very small size may be realized.

What is claimed is:

1. A resin-sealed semiconductor device, comprising:
   a semiconductor element;
   a die pad supporting the semiconductor element;
   a bonding material for bonding the semiconductor element to the die pad;
   bonding wires;

a plurality of signal leads electrically connected to the semiconductor element through the bonding wires; and a sealing member for sealing the semiconductor element, the die pad, the bonding material, the bonding wires, and a part of the plurality of signal leads with a sealing resin, wherein:

a central portion of each of the plurality of signal leads is lifted from a peripheral portion thereof;

the die pad has an exposure portion which is at least a part of a bottom surface of the die pad and exposed on a bottom surface of the sealing member;

each of the plurality of signal leads has an exposure portion which corresponds to an end portion of corresponding one of the plurality of signal leads and is partially exposed as an external connection terminal on the bottom surface of the sealing member;

the die pad further includes a thin portion provided substantially parallel to a mounting surface of the die pad in a side surface portion of the die pad;

each of the plurality of signal leads further includes an lifted inner lead which corresponds to an other end portion of corresponding one of the plurality of signal leads; and the lifted inner lead includes:
    a bend portion for aligning an upper surface of the die pad and a rear surface of the lifted inner lead to substantially the same height;
    a protruding shape portion provided on one side in a signal lead width direction; and
    an inclined vertical surface provided on an other side as an inside in the signal lead width direction.

2. A resin-sealed semiconductor device according to claim 1, wherein:
    the protruding shape portion of the lifted inner lead which is located on the one side is provided in a direction toward an outside of the sealing member; and
    the inclined vertical surface of the lifted inner lead which is located on the other side is provided in a direction toward an inside of the sealing member.

3. A resin-sealed semiconductor device according to claim 1, wherein the bend portion includes a vertical shape portion relative to a bottom surface of the external connection terminal, which is formed between an upper surface portion of the lifted inner lead and an upper surface portion of the external connection terminal and between a rear surface portion of the lifted inner lead and a bottom surface portion of the external connection terminal.

4. A resin-sealed semiconductor device according to claim 3, wherein:
    the vertical shape portion of the bend portion includes a surface parallel to a side of the sealing member; and
    the inclined vertical surface provided on the inside in the signal lead width direction is opposed in parallel to a side of the die pad.

5. A resin-sealed semiconductor device according to claim 1, wherein the lifted inner lead further includes a cutaway portion provided along the bend portion and the external connection terminal on a side of the inclined vertical surface located on the inside in the signal lead width direction.

6. A resin-sealed semiconductor device according to claim 3, wherein a height of the upper surface portion of the lifted inner lead is higher than an upper surface height of the semiconductor element provided on the die pad.

7. A resin-sealed semiconductor device according to claim 1, wherein a flat upper surface portion length of the lifted inner lead is longer than a flat rear surface portion length of the lifted inner lead.

8. A resin-sealed semiconductor device according to claim 1, wherein a flat rear surface portion length of the external connection terminal is longer than a flat upper surface portion length of the external connection terminal.

9. A resin-sealed semiconductor device according to claim 1, wherein the die pad and each of the plurality of signal leads are 50 μm to 80 μm in thickness.

10. A resin-sealed semiconductor device according to claim 1, wherein a distance between a tip end portion side of the thin portion of the die pad and the inclined vertical surface of the lifted inner lead is smaller than a thickness of the die pad.

11. A resin-sealed semiconductor device according to claim 1, wherein the die pad includes at least one pair of hanger pin shape portions which are formed from vertex portions of sides of the die pad and extend to sides of the sealing member at the same thickness as the die pad.

12. A resin-sealed semiconductor device according to claim 1, wherein the lifted inner lead is provided in a substantially central portion of each side of the die pad.

13. A resin-sealed semiconductor device according to claim 1, wherein the lifted inner leads are provided to sandwich at least one pair of hanger pin shape portions provided in vertex portions of sides of the die pad.

14. A resin-sealed semiconductor device according to claim 1, wherein the thin portion provided substantially parallel to the mounting surface of the die pad in the side surface portion of the die pad comprises a pair of thin portions each of which is linked to two sides of the side surface portion of the die pad.

15. A resin-sealed semiconductor device according to claim 1, wherein the resin-sealed semiconductor device is 0.5 mm to 1.0 mm in side length.

16. A method of manufacturing a resin-sealed semiconductor device, comprising:
    preparing a lead frame, including:
        forming a die pad and a plurality of signal leads and forming a protruding shape portion and an inclined vertical surface in each of inner leads of the plurality of signal leads;
        forming a bend portion between each of the inner leads and an external connection terminal of each of the plurality of signal leads; and
        forming a thin portion in a side surface portion of the die pad;
    mounting a semiconductor element on the die pad through a bonding material;
    electrically connecting the semiconductor element to the inner leads through bonding wires;
    sealing the semiconductor element, the die pad, the bonding material, the bonding wires, and the plurality of signal leads with a sealing resin; and
    separating the resin-sealed semiconductor device from a main body of the lead frame.

17. A method of manufacturing a resin-sealed semiconductor device, comprising:
    forming a die pad and a signal lead including an inner lead so that the inner lead includes a protruding shape portion provided on one side in a signal lead width direction and an inclined vertical surface provided on an other side as an inside in the signal lead width direction;
    providing a thin portion substantially parallel to a mounting surface of the die pad in a side surface portion of the die pad;
    forming a bend portion between the inner lead and an external connection terminal of the signal lead to align an upper surface of the die pad and a rear surface of the inner lead to substantially the same height;
mounting a semiconductor element on the die pad through a bonding material;
electrically connecting the semiconductor element to the inner leads through wire bonds; and
performing sealing with a sealing resin to expose, on a bottom surface, at least a part of a bottom surface of the die pad and a part of an end portion of the signal lead which corresponds to the external connection terminal.

* * * * *